(12) United States Patent
Liu et al.

(10) Patent No.: US 12,101,973 B2
(45) Date of Patent: Sep. 24, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Biao Liu, Beijing (CN); Mengmeng Du, Beijing (CN); Xiangdan Dong, Beijing (CN); Hongwei Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 381 days.

(21) Appl. No.: 17/428,402

(22) PCT Filed: Apr. 26, 2020

(86) PCT No.: PCT/CN2020/086997
§ 371 (c)(1),
(2) Date: Aug. 4, 2021

(87) PCT Pub. No.: WO2021/217295
PCT Pub. Date: Nov. 4, 2021

(65) Prior Publication Data
US 2022/0320247 A1    Oct. 6, 2022

(51) Int. Cl.
*H10K 59/131*    (2023.01)
*G09G 3/3233*    (2016.01)
(Continued)

(52) U.S. Cl.
CPC ........ *H10K 59/131* (2023.02); *H10K 50/813* (2023.02); *G09G 3/3233* (2013.01);
(Continued)

(58) Field of Classification Search
CPC .. H10K 59/131; H10K 59/351; H10K 50/813; G09G 3/3233; G09G 2300/0426; G09G 2300/0819; G09G 2300/0842
See application file for complete search history.

(56) References Cited

U.S. PATENT DOCUMENTS 9,245,932 B2    1/2016    Yoon et al.
9,935,156 B2    4/2018    Yoon et al.
(Continued)

FOREIGN PATENT DOCUMENTS

CN    106067476 A        11/2016
CN    201810137014.6    *  2/2018
(Continued)

OTHER PUBLICATIONS

Extended European Search Report dated Sep. 14, 2023 received in European Patent Application No. EP 20904234.0.
(Continued)

*Primary Examiner* — Timor Karimy
(74) *Attorney, Agent, or Firm* — Scully, Scott, Murphy & Presser, P.C.

(57) ABSTRACT

A display substrate and a display device are provided. The display substrate includes a first power signal line and a pixel defining layer. The first power signal line includes first power signal sub-lines extending along a first direction and second power signal sub-lines extending along a second direction. The pixel defining layer includes a plurality of openings to define effective light-emitting regions of a plurality of sub-pixels, the plurality of sub-pixels include a sub-pixel pair including two sub-pixels arranged along the
(Continued)

second direction, and the sub-pixel pair includes two effective light-emitting sub-regions with an interval therebetween. In a plan view, the first power signal sub-line passes through the interval between the two effective light-emitting sub-regions, at least one second power signal sub-line includes a fracture, and the two effective light-emitting sub-regions are located at the fracture.

19 Claims, 9 Drawing Sheets

(51) Int. Cl.
    *H10K 50/813*     (2023.01)
    *H10K 59/35*     (2023.01)

(52) U.S. Cl.
    CPC ............ *G09G 2300/0426* (2013.01); *G09G 2300/0819* (2013.01); *G09G 2300/0842* (2013.01); *H10K 59/351* (2023.02)

(56) References Cited

U.S. PATENT DOCUMENTS

| | | | |
|---|---|---|---|
| 11,081,539 B2 | 8/2021 | Liu et al. |
| 11,106,098 B2 | 8/2021 | Zhao et al. |
| 11,903,274 B2 | 2/2024 | Yang et al. |
| 2015/0048322 A1 | 2/2015 | So et al. |
| 2016/0260792 A1 | 9/2016 | Kim et al. |
| 2017/0236882 A1 | 8/2017 | Matsunaga et al. |
| 2018/0159064 A1 | 6/2018 | Wu et al. |
| 2018/0190752 A1 | 7/2018 | An et al. |
| 2018/0350886 A1 | 12/2018 | An et al. |
| 2020/0043990 A1 | 2/2020 | Huangfu et al. |
| 2020/0168692 A1* | 5/2020 | Liu .................... H10K 59/353 |
| 2021/0193766 A1 | 6/2021 | Liu et al. |

FOREIGN PATENT DOCUMENTS

| | | |
|---|---|---|
| CN | 109301088 A | 2/2019 |
| CN | 110133885 A | 8/2019 |
| CN | 110137214 A | 8/2019 |
| CN | 110444569 A | 11/2019 |
| CN | 111490068 A | 8/2020 |
| EP | 3480807 A1 | 5/2019 |
| WO | 2019153938 A1 | 8/2019 |

OTHER PUBLICATIONS

Extended European Search Report dated Jul. 25, 2023 received in European Patent Application No. EP 20929680.5.
Office Action dated Jul. 16, 2024 received in U.S. Appl. No. 18/539,847.
Extended European search report dated Jun. 4, 2024 received in European Patent Application No. 209317080.

\* cited by examiner

DISPLAY SUBSTRATE AND DISPLAY DEVICE

CROSS-REFERENCE TO RELATED APPLICATIONS

The present application is a national phase entry of PCT International Application No. PCT/CN2020/086997, filed on Apr. 26, 2020. The entire disclosure of PCT International Application No. PCT/CN2020/086997 is incorporated herein by reference in its entirety as part of the present application.

TECHNICAL FIELD

At least one embodiment of the present disclosure relates to a display substrate and a display device.

BACKGROUND

Organic light-emitting diodes (OLEDs) have advantages such as self-illumination, high efficiency, bright colors, small weight and thickness, and power saving, and have been gradually applied in the fields of large-area display, lighting, vehicle-mounted display and the like. In order to improve the uniformity of the organic light-emitting diode display device, a two-layered power signal line structure can be adopted, and a power signal line near a light-emitting layer side of an organic light-emitting diode forms a grid pattern to reduce a voltage drop of the power signal line.

SUMMARY

At least one embodiment of the present disclosure provides a display substrate and a display device.

At least one embodiment of the present disclosure provides a display substrate, comprising: a base substrate; a first power signal line on the base substrate, the first power signal line comprising a plurality of first power signal sub-lines extending along a first direction and a plurality of second power signal sub-lines extending along a second direction, wherein the first power signal sub-lines are connected with the second power signal sub-lines; a pixel defining layer at a side of the first power signal line away from the base substrate, the pixel defining layer comprising a plurality of openings to define effective light-emitting regions of a plurality of sub-pixels, wherein the plurality of sub-pixels comprise a sub-pixel pair including two sub-pixels arranged along the second direction, and the sub-pixel pair comprises two effective light-emitting sub-regions with an interval therebetween; in a plan view, the first power signal sub-line passes through the interval between the two effective light-emitting sub-regions, at least one second power signal sub-line comprises at least one fracture, and both the two effective light-emitting sub-regions and the interval between the two effective light-emitting sub-regions are located at the fracture, so that a virtual straight line extending along the second direction and connecting two ends of a same fracture of the second power signal sub-line passes through the two effective light-emitting sub-regions and the interval.

For example, in an embodiment of the disclosure, along a direction perpendicular to the base substrate, the second power signal sub-line comprising the fracture has no overlap with the two effective light-emitting sub-regions and has no overlap with the interval.

For example, in an embodiment of the disclosure, the display substrate further comprises: a plurality of second power signal lines extending along the second direction and located between the first power signal line and the base substrate, and the second power signal line and the second power signal sub-line being electrically connected through a via hole located in an insulating layer between the second power signal sub-line and the second power signal line, wherein an orthographic projection of the second power signal sub-line on the base substrate at least partially overlaps with an orthographic projection of the second power signal line on the base substrate, and orthographic projections of the two effective light-emitting sub-regions on the base substrate overlap with the orthographic projection of the second power signal line on the base substrate.

For example, in an embodiment of the disclosure, a ratio of distances from an orthographic projection of the first power signal sub-line on the base substrate to two centers of the orthographic projections of the two effective light-emitting sub-regions on the base substrate is 0.9-1.1.

For example, in an embodiment of the disclosure, two centers of the orthogonal projections of the two effective light-emitting sub-regions on the base substrate are located within the orthogonal projection of the second power signal line on the base substrate.

For example, in an embodiment of the disclosure, the display substrate comprises a plurality of repeating units on the base substrate, and each of the plurality of repeating units comprises one first color sub-pixel, one second color sub-pixel pair and one third color sub-pixel sequentially arranged along the first direction, wherein the second color sub-pixel pair comprises two second color sub-pixels of the same color, and the sub-pixel pair including two sub-pixels arranged along the second direction is the second color sub-pixel pair, the first color sub-pixel comprises a first effective light-emitting region, the two effective light-emitting sub-regions are two second effective light-emitting regions, and the third color sub-pixel comprises a third effective light-emitting region.

For example, in an embodiment of the disclosure, along the second direction, a size of the interval is smaller than that of the first effective light-emitting region, and the size of the interval is smaller than that of the third effective light-emitting region.

For example, in an embodiment of the disclosure, in a direction perpendicular to the base substrate, the first effective light-emitting region has no overlap with the second power signal sub-line and the second power signal line.

For example, in an embodiment of the disclosure, the first effective light-emitting region is located between adjacent second power signal sub-lines, and the first effective light-emitting region is located between adjacent second power signal lines.

For example, in an embodiment of the disclosure, a center of an orthographic projection of the first effective light-emitting region on the base substrate is located within an orthographic projection of the first power signal sub-line on the base substrate.

For example, in an embodiment of the disclosure, the display substrate further comprises: a plurality of pads extending along the second direction and arranged on the same layer as the first power signal line, wherein two second power signal sub-lines at both sides of the first effective light-emitting region and immediately adjacent to the first effective light-emitting region have different distances from a center line of the first effective light-emitting region extending along the second direction, and the first effective light-emitting region is located between the pad and one of the two second power signal sub-lines which is closer to the center line of the first effective light-emitting region.

For example, in an embodiment of the disclosure, in the first direction, a ratio of distances from the center line of the first effective light-emitting region to the pad and the second power signal sub-line located at both sides of the first effective light-emitting region is 0.9-1.1.

For example, in an embodiment of the disclosure, in a direction perpendicular to the base substrate, the pad overlaps with the first power signal sub-line and is electrically connected with the first power signal sub-line.

For example, in an embodiment of the disclosure, the pad has an approximately strip shape, and a center of an orthographic projection of the pad on the base substrate is located within an orthographic projection of the first power signal sub-line on the base substrate.

For example, in an embodiment of the disclosure, the pad is disposed between the first color sub-pixel and the third color sub-pixel which are arranged along the first direction and adjacent to each other, and the pad is electrically connected with the second power signal sub-line between the first color sub-pixel and the third color sub-pixel.

For example, in an embodiment of the disclosure, the display substrate further comprises: a connecting part disposed in the same layer as the pad and located between the second power signal sub-line and the pad, wherein the pad is connected with the second power signal sub-line through the connecting part.

For example, in an embodiment of the disclosure, an interval is provided between the pad and the second power signal sub-line connected to the pad, the connecting part is located between the pad and the second power signal sub-line, and the connecting part, the pad and the second power signal sub-line form an annular structure.

For example, in an embodiment of the disclosure, a plurality of second power signal sub-lines comprises a first signal sub-line and a second signal sub-line alternately arranged along the first direction, wherein the first signal sub-line is a continuous signal line, and the second signal sub-line is a signal line with the fracture.

For example, in an embodiment of the disclosure, the pad is connected with the second signal sub-line through the connecting part, and an orthographic projection of the pad on another second signal sub-line adjacent to the second signal sub-line connected to the pad is located in the fracture of said another second signal sub-line.

For example, in an embodiment of the disclosure, along the second direction, a size of the pad is smaller than a size of the first effective light-emitting region.

For example, in an embodiment of the disclosure, in a direction perpendicular to the base substrate, the third effective light-emitting region has no overlap with the second power signal sub-line and the second power signal line.

For example, in an embodiment of the disclosure, the third effective light-emitting region is located between adjacent second power signal sub-lines, and the third effective light-emitting region is located between adjacent second power signal lines.

For example, in an embodiment of the disclosure, a center of an orthographic projection of the third effective light-emitting region on the base substrate is located within an orthographic projection of the first power signal sub-line on the base substrate.

For example, in an embodiment of the disclosure, a ratio of distances from centers of orthographic projections of the two second power signal sub-lines located at both sides of the third color sub-pixel and immediately adjacent to the third color sub-pixel on the base substrate to a center of an orthographic projection of the third effective light-emitting region on the base substrate is 0.9-1.1.

For example, in an embodiment of the disclosure, each sub-pixel comprises an organic light-emitting element, and the organic light-emitting element comprises a first electrode, a light-emitting layer and a second electrode which are sequentially stacked, at least a part of the light-emitting layer is located in the opening, and the second electrode is located at a side of the pixel defining layer facing the base substrate, in the first color sub-pixel, an area ratio of the first effective light-emitting region to the second electrode is 53%-55%; in the second color sub-pixel pair, an area ratio of the two second effective light-emitting regions to the two second electrodes is 43.5%-48%; in the third color sub-pixel, an area ratio of the third effective light-emitting region to the second electrode is 67.5%-69%.

For example, in an embodiment of the disclosure, a shape of the first effective light-emitting region and a shape of the third effective light-emitting region comprise hexagon or oval, and a shape of each of the two second effective light-emitting regions comprised in the second color sub-pixel pair comprises pentagon, circle or water drop.

For example, in an embodiment of the disclosure, the second electrode of each of the color sub-pixels comprises a main electrode and a connecting electrode connected with each other, and a shape of the main electrode is substantially the same as that of the effective light-emitting region of the corresponding sub-pixel; in each of the color sub-pixels, a part where the connecting electrode is connected with the main electrode is provided with a notch, and along a direction perpendicular to the base substrate, a region of the display substrate corresponding to at least a part of the notch is a transparent region.

For example, in an embodiment of the disclosure, the display substrate further comprises: a plurality of data lines extending along the second direction and arranged in the same layer as the second power signal line; a plurality of scanning signal lines extending along the first direction and located at a side of a film layer where the data lines are located facing the base substrate; a plurality of reset power signal lines extending along the first direction and located between a film layer where the scanning signal lines are located and the film layer where the data lines are located; a plurality of reset control signal lines extending along the first direction and arranged in the same layer as the scanning signal lines; and a plurality of light-emitting control signal lines extending along the first direction and arranged in the same layer as the scanning signal lines, wherein each of the sub-pixels further comprises a pixel circuit for driving the organic light-emitting element, and the pixel circuit comprises a driving transistor, a data writing transistor, a storage capacitor, a threshold compensation transistor, a first light-emitting control transistor, a second light-emitting control transistor, a first reset transistor and a second reset transistor; a first electrode of the data writing transistor is electrically connected with a first electrode of the driving transistor, a second electrode of the data writing transistor is electrically connected with the data line to receive a data signal, and a gate of the data writing transistor is electrically connected with the scanning signal line to receive a scanning signal; a first electrode of the storage capacitor is electrically connected with the second power signal line, and a second electrode of the storage capacitor is electrically connected with a gate of the driving transistor; a first electrode of the threshold compensation transistor is electrically connected with a second electrode of the driving transistor, a second electrode of the threshold compensation transistor is electrically connected with the gate of the driving transistor, and a gate of the threshold compensation transistor is electrically connected with the scanning signal line to receive a compensation control signal; a first electrode of the first reset transistor is electrically connected with the reset power signal line to receive a first reset signal, a second electrode of the first reset transistor is electrically connected with the gate of the driving transistor, and a gate of the first reset transistor is electrically connected with the reset control signal line to receive a first reset control sub-signal; a first electrode of the second reset transistor is electrically connected with the reset power signal line to receive a second reset signal, a second electrode of the second reset transistor is electrically connected with the first electrode of the organic light-emitting element, and a gate of the second reset transistor is electrically connected with the reset control signal line to receive a second reset control sub-signal; a first electrode of the first light-emitting control transistor is electrically connected with the second power signal line, a second electrode of the first light-emitting control transistor is electrically connected with the first electrode of the driving transistor, and a gate of the first light-emitting control transistor is electrically connected with the light-emitting control signal line to receive a first light-emitting control signal; a first electrode of the second light-emitting control transistor is electrically connected with the second electrode of the driving transistor, a second electrode of the second light-emitting control transistor is electrically connected with the second electrode of the organic light-emitting element, and a gate of the second light-emitting control transistor is electrically connected with the light-emitting control signal line to receive a second light-emitting control signal; wherein the display substrate further comprises a first connecting part, a second connecting part and a third connecting part which are arranged in the same layer as the data lines, and a fourth connecting part which is arranged in the same layer as the first power signal line, the first connecting part is configured to connect the second electrode of the threshold compensation transistor and the gate of the driving transistor, the second connecting part is configured to connect the reset power signal line and the first electrode of the second reset transistor, the third connecting part is configured to connect the second electrode of the second light-emitting control transistor and the fourth connecting part, and the fourth connecting part is configured to connect the third connecting part and the connecting electrode of the second electrode of the organic light-emitting element.

For example, in an embodiment of the disclosure, the transparent region comprises a region where the pixel circuit, the first power signal line, the second power signal line, the data line, the scanning signal line, the reset power signal line, the reset control signal line and the light-emitting control signal line are not provided.

For example, in an embodiment of the disclosure, along a direction perpendicular to the base substrate, an area surrounded by the light-emitting control signal line connected to the pixel circuit of the first color sub-pixel, the second power signal line, an active semiconductor layer including a channel region and a source-drain doped region of each transistor of each sub-pixel, and the first electrode of the storage capacitor has an overlap with the notch of the second electrode of the first color sub-pixel.

For example, in an embodiment of the disclosure, along a direction perpendicular to the base substrate, in an area surrounded by the light-emitting control signal line connected to the pixel circuit of the first color sub-pixel in the second color sub-pixel pair, the second power signal line and the first electrode of the storage capacitor, a region close to the light-emitting control signal line has an overlap with the notch of the second electrode of the first sub-pixel.

For example, in an embodiment of the disclosure, in the second sub-pixel of the second color sub-pixel pair, the connecting electrode comprises a first part extending along the second direction and a curved second part, the first part is located at a side of the second part away from the main electrode, the second part is connected with the main electrode, and a maximum size of the first part along the first direction is larger than a maximum size of the second part along the first direction.

For example, in an embodiment of the disclosure, in the second sub-pixel, the connecting electrode has no overlap with the source-drain doped region of the first light-emitting control transistor.

For example, in an embodiment of the disclosure, along a direction perpendicular to the base substrate, in an area surrounded by the light-emitting control signal line connected to the pixel circuit of the second sub-pixel, the second power signal line and the third connecting part, a region close to the second power signal line and the light-emitting control signal line has an overlap with the notch of the second electrode of the second sub-pixel.

For example, in an embodiment of the disclosure, along a direction perpendicular to the base substrate, in an area surrounded by the data line connected to the pixel circuit of the second sub-pixel, the active semiconductor layer and a film layer where the first electrode of the storage capacitor is located, a region away from the light-emitting control signal line has an overlap with the notch of the second electrode of the third color sub-pixel.

For example, in an embodiment of the disclosure, the first color sub-pixel is a red sub-pixel, the second color sub-pixel is a green sub-pixel, and the third color sub-pixel is a blue sub-pixel.

At least one embodiment of the disclosure comprises a display device, comprising the display substrate as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
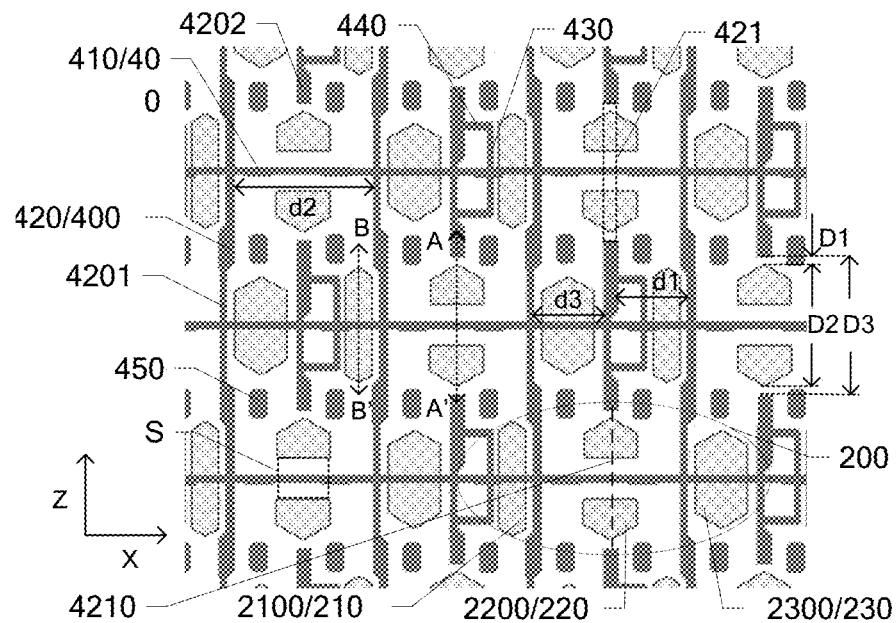
FIG. 1A is a plan view illustrating a positional relationship between a first power signal line and an effective light-emitting region in a display substrate provided according to an embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components.

The organic light-emitting diode display device includes a pixel defining layer including an opening for defining a light-emitting region of a sub-pixel, and the opening exposes an anode of an organic light-emitting element. When a subsequent light-emitting layer of the organic light-emitting element is formed in the opening of the pixel defining layer, the light-emitting layer contacts the anode, so that this part can drive the light-emitting layer to emit light to form a light-emitting region.

During the research, the inventor(s) of the present application found that, in the organic light-emitting diode display, when the power signal line close to the light-emitting layer side of the organic light-emitting diode overlaps with the opening, the power signal line located in the light-emitting region is easy to cause a color deviation.

Embodiments of the present disclosure provide a display substrate and a display device. The display substrate includes a base substrate, a first power signal line located on the base substrate, and a pixel defining layer located at a side of the first power signal line away from the base substrate. The first power signal line includes a plurality of first power signal sub-lines extending along a first direction and a plurality of second power signal sub-lines extending along a second direction, and the first power signal sub-lines are connected with the second power signal sub-lines; the pixel defining layer includes a plurality of openings to define effective light-emitting regions of a plurality of sub-pixels, the plurality of sub-pixels include sub-pixel pairs each including two sub-pixels arranged along the second direction, and the sub-pixel pair includes two effective light-emitting sub-regions spaced apart from each other. In a plan view, the first power signal sub-line passes through a gap between two effective light-emitting sub-regions, and at least one second power signal sub-line includes a fracture, the two effective light-emitting sub-regions and the gap between the two effective light-emitting sub-regions are all located at the fracture, so that a virtual straight line extending along the second direction and connecting two ends of the same fracture of the second power signal sub-line passes through the two effective light-emitting sub-regions and the gap. According to the embodiment of the present disclosure, by providing a fracture in the second power signal sub-line to reduce an overlapping area between the two effective light-emitting sub-regions and the first power signal line, it can avoid the occurrence of color deviation in the sub-pixel pair during display as far as possible.

Hereinafter the display substrate and the display device provided by the embodiments of the present disclosure will be described with reference to the drawings.

Figure 1B:
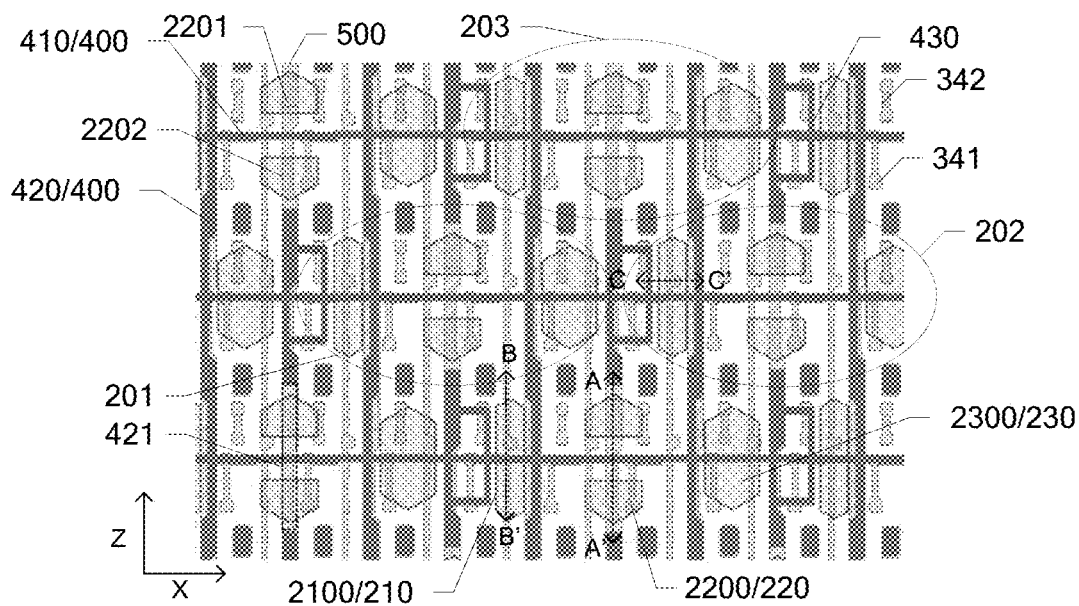
FIG. 1B is a plan view illustrating a positional relationship among a first power signal line, a second power signal line and an effective light-emitting region in the display substrate illustrated in FIG. 1A.
Figure 2:
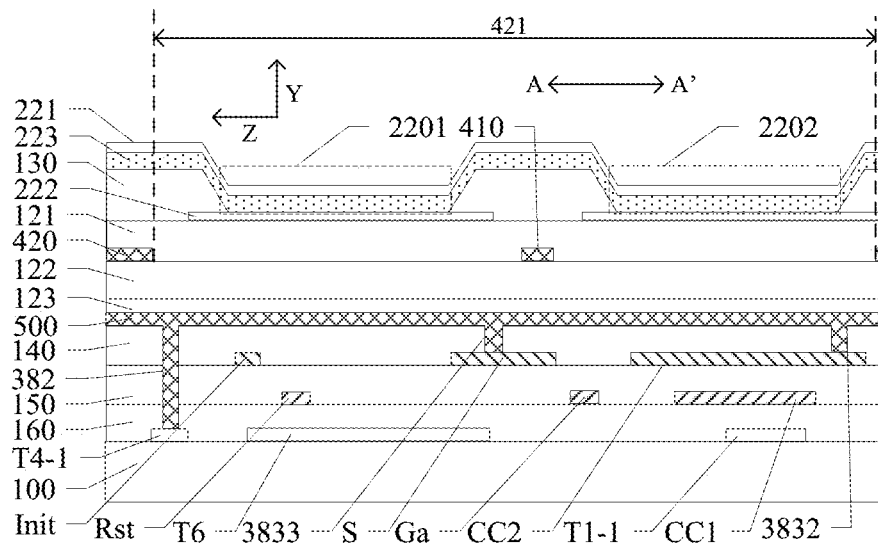
FIG. 2 is a schematic diagram of a partial cross-sectional structure taken along AA' line illustrated in FIGS. 1A and 1B.

FIG. 1A is a plan view illustrating a positional relationship between a first power signal line and an effective light-emitting region in a display substrate provided according to an embodiment of the present disclosure; FIG. 1B is a plan view illustrating a positional relationship among a first power signal line, a second power signal line and an effective light-emitting region in the display substrate illustrated in FIG. 1A; and FIG. 2 is a schematic diagram of a partial cross-sectional structure taken along AA' line illustrated in FIGS. 1A and 1B. As illustrated in FIGS. 1A-2, the display substrate includes a base substrate 100 and a plurality of repeating units 200 located on the base substrate 100. Each repeating unit 200 includes one first color sub-pixel 210, one second color sub-pixel pair 220 and one third color sub-pixel 230 arranged along a first direction (the X direction illustrated in the figure), and two second color sub-pixels included in the second color sub-pixel pair 220 are arranged along a second direction (the Z direction illustrated in the figure, which is different from the first direction). The plurality of repeating units 200 are arranged along the first direction to form a plurality of repeating unit groups, the plurality of repeating unit groups are arranged along the second direction, and adjacent repeating unit groups among the plurality of repeating unit groups are staggered with each other along the first direction, that is, the adjacent repeating unit groups have a certain offset along the first direction. Therefore, sub-pixels of the same color in adjacent repeating unit groups are not aligned in the second direction. Pixels in odd rows of repeating unit groups are arranged in the same way, and pixels in even rows of repeating unit groups are arranged in the same way.

For example, the offset of adjacent repeating unit groups in the first direction is approximately one half of a size of the repeating unit 200 in the first direction. For example, the size of the repeating unit 200 in the first direction is a pitch of the repeating unit 200 in the first direction. Here, the pitch refers to a distance between centers of light-emitting regions of two first color sub-pixels 210 in two adjacent repeating units 200 along the first direction; here, the center of the light-emitting region refers to a geometric center of a planar shape of the light-emitting region.

The first direction and the second direction are two directions perpendicular to each other in a same plane. For example, the plane is a plane where pixels are arranged.

Here, the repeating unit only refers to the repetition of sub-pixels, and other structures may be different or the same. In addition, the above-mentioned "repetition" means that the approximate position, shape and size are almost the same. In some cases, to meet the demands of wiring or the opening, the shape may be slightly different. For example, the opening may be provided at different positions.

For example, in an example of the embodiment of the present disclosure, the first color sub-pixel 210 may be a red sub-pixel, the second color sub-pixel pair 220 may be a green sub-pixel pair, and the third color sub-pixel 230 may be a blue sub-pixel. However, the embodiments are not limited thereto, and the colors of the sub-pixels can be interchanged.

As illustrated in FIGS. 1A-2, the display substrate further includes a first power signal line 400 located on the base substrate 100, the first power signal line 400 includes a plurality of first power signal sub-lines 410 extending along the first direction and a plurality of second power signal sub-lines 420 extending along the second direction; the first power signal sub-lines 410 are connected with the second power signal sub-lines 420.

As illustrated in FIGS. 1A-2, the display substrate further includes a pixel defining layer 130 located at a side of the first power signal line 400 away from the base substrate 100, and the pixel defining layer 130 includes a plurality of openings to define the effective light-emitting regions of respective sub-pixels. The "effective light-emitting region" here may refer to a two-dimensional planar region which is parallel to the base substrate. It should be noted that, due to a manufacturing process of the opening in the pixel defining layer, a size of a portion of the opening away from the base substrate is slightly larger than that of a portion close to the base substrate, or the size gradually increases from the side close to the base substrate to the side away from the base substrate. Therefore, the size of the effective light-emitting region may be slightly different from the size of the opening in the pixel defining layer at different positions, but the shape and size of the entire region are basically equivalent. For example, a projection of the effective light-emitting region on the base substrate roughly coincides with a projection of the opening in the corresponding pixel defining layer on the base substrate. For example, the projection of the effective light-emitting region on the base substrate completely falls within the projection of the opening in the corresponding pixel defining layer on the base substrate, and the shapes of the two projections are similar, so an area of the projection of the effective light-emitting region on the base substrate is slightly smaller than that of the opening in the corresponding pixel defining layer.

For example, each sub-pixel includes an organic light-emitting element including a first electrode, a light-emitting layer and a second electrode which are sequentially stacked; at least a part of the light-emitting layer is located in the opening, and the second electrode is located at a side of the pixel defining layer facing the base substrate. For example, as illustrated in FIG. 2, taking one second color sub-pixel included in the second color sub-pixel pair as an example, the second color sub-pixel includes an organic light-emitting element including a first electrode 221, a second electrode 222 and a light-emitting layer 223 located between the first electrode 221 and the second electrode 222. The opening of the pixel defining layer 130 exposes a part of the second electrode 222. When the light-emitting layer 223 is formed in the opening of the pixel defining layer 130, the light-emitting layer 223 contacts the second electrode 222, so that this part can drive the light-emitting layer to emit light to form the second effective light-emitting region 2200. The second color sub-pixel pair 220 includes two second effective light-emitting regions 2201 and 2202.

The embodiment of the present disclosure is described with reference to the case where the light-emitting layers of two second color sub-pixels included in a second color sub-pixel pair are integrated by way of example, for example, the light-emitting layers of the two second color sub-pixels in the second color sub-pixel pair are connected to form an integral film layer, that is, the light-emitting layers of the two second color sub-pixels are formed as a continuous and complete pattern, or the projection of the light-emitting layers of the two second color sub-pixels on the base substrate is continuous and complete, and the light-emitting layers of the two second color sub-pixels can be manufactured through one opening. However, the embodiments are not limited thereto, for example, the light-emitting layers of two second color sub-pixels included in the second color sub-pixel pair may also be separate.

As illustrated in FIGS. 1A-2, the first color sub-pixel 210 includes a first effective light-emitting region 2100, the second color sub-pixel pair includes two second effective light-emitting regions 2200 (including a first effective light-emitting sub-region 2201 and a second effective light-emitting sub-region 2202) with an interval therebetween, and the third color sub-pixel 230 includes a third effective light-emitting region 2300. In the figure, the part of the light-emitting layer in contact with the second electrode in the opening of the pixel defining layer is taken as the effective light-emitting region by way of example. The "interval" in the above-mentioned "the second color sub-pixel pair includes two second effective light-emitting regions 2200 with an interval therebetween" refers to a solid part of the pixel defining layer between two openings defined by the pixel defining layer. As illustrated in FIG. 1A, an orthogonal projection of the interval S on a straight line extending in the X direction can basically coincide with an orthogonal projection of the second color sub-pixel pair on the straight line extending in the X direction, and the orthogonal projection of the interval S on a straight line extending in the Z direction is located between two orthogonal projections of the second color sub-pixel pair on the straight line extending in the Z direction.

As illustrated in FIG. 1A-FIG. 2, in a plan view, for example, in a plane parallel to the base substrate 100 (or an orthographic projection of a subsequent structure on the plane), the first power signal sub-line 410 passes through the interval between two second effective light-emitting regions 2200, at least one second power signal sub-line 420 includes a fracture 421, and the two second effective light-emitting regions 2200 and the above-mentioned interval are located at the fracture 421 so that the second power signal sub-line 420 does not penetrate through the two second effective light-emitting regions 2200 and the above-mentioned interval. That is, a virtual straight line 4210 connecting two end points of the fracture 421 and extending along the Z direction passes through the two second effective light-emitting regions 2200 and the interval S between the two second effective light-emitting regions 2200. The above-mentioned "fracture" means that the second power signal sub-line 420 is not a continuous signal line, and the signal line includes a plurality of signal line segments disconnected from each other, and an interval between two adjacent signal line segments is just the above-mentioned fracture 421.

For example, in a direction perpendicular to the base substrate 100, the second power signal sub-line 420 with the fracture 421 has no overlap with any of the two second effective light-emitting regions 2200 and the interval S.

For example, in the direction perpendicular to the base substrate 100, the two second effective light-emitting regions 2200 have no overlap with the first power signal line 400. That is, in the direction perpendicular to the base substrate 100, the two second effective light-emitting regions 2200 have an overlap with the fracture 421 but have no overlap with the second power signal sub-line 420, and the two second effective light-emitting regions 2200 have no overlap with the first power signal sub-line 410, either. Therefore, along the direction perpendicular to the base substrate, the two second effective light-emitting regions included in the second color sub-pixel pair both have no overlap with the first power signal line, so as to improve the flatness of a film layer located on the side of the second electrode away from the light-emitting layer in the two second effective light-emitting regions, and to avoid the occurrence of color deviation in the second color sub-pixel pair during display as far as possible.

For example, as illustrated in FIGS. 1A and 1B, a size of the interval between two second effective light-emitting regions 2200 along the second direction is smaller than that of the first effective light-emitting region 2100 along the second direction, and a size of the interval between two second effective light-emitting regions 2200 along the second direction is smaller than that of the third effective light-emitting region 2300 along the second direction.

For example, along the second direction, the size of the first effective light-emitting region 2100 is larger than that of the third effective light-emitting region 2300. For example, the size of the first effective light-emitting region 2100 may be 45 microns to 49 microns, for example, 47 microns. The size of the third effective light-emitting region 2300 may be 38 microns to 42 microns, for example, 40 microns.

For example, as illustrated in FIGS. 1A and 1B, a ratio of distances from the orthographic projection of the first power signal sub-line 410 on the base substrate 100 to two centers of the two orthographic projections of the two second effective light-emitting regions 2200 on the base substrate 100 is 0.9-1.1. For example, distances from the orthographic projection of the first power signal sub-line 410 on the base substrate 100 to the two centers of the two orthographic projections of the two second effective light-emitting regions 2200 on the base substrate 100 are substantially the same. In this way, the two second effective light-emitting regions included in the second color sub-pixel pair are symmetrically distributed relative to the first power signal sub-line, which is beneficial to ensuring the environmental consistency of the two second color sub-pixels included in the second color sub-pixel pair. For example, the orthographic projection of the first power signal sub-line 410 on the base substrate 100 may also be closer to one of the second color sub-pixel pairs. For example, the orthographic projection of the first power signal sub-line 410 on the base substrate 100 has no overlap with projections of second electrodes of the two second color sub-pixels in the second color sub-pixel pair.

The center of the orthographic projection mentioned above refers to a geometric center of a shape of the orthographic projection. The shape of the orthographic projection of the effective light-emitting region on the base substrate is determined by the shape of the effective light-emitting region, and the shape of the effective light-emitting region is substantially the same with the shape of the opening of the pixel defining layer corresponding to the effective light-emitting region.

For example, as illustrated in FIGS. 1A and 1B, the shape of each second effective light-emitting region 2200 included in the second color sub-pixel pair 220 includes a shape of pentagon, circle or water drop. For example, FIG. 1A and FIG. 1B schematically illustrate that the shape of each second effective light-emitting region 2200 is a pentagon, which includes a set of opposite sides parallel to each other (parallel to the second direction) and a vertical side (parallel to the first direction), and the vertical side is perpendicular to the set of opposite sides parallel to each other; vertical sides of two second effective light-emitting regions 2200 in each second color sub-pixel pair 220 are adjacent to each other. For example, the first power signal sub-line 410 is located between the two vertical sides and passes through a midpoint of a shortest connecting line between the two vertical sides.

In addition, although the shape of the second effective light-emitting region of the second color sub-pixel in FIGS. 1A and 1B includes an angle strictly formed by two line segments, in some embodiments the shapes of the second effective light-emitting regions of the second color sub-pixel may all be patterns with rounded corners, such as a shape of circle or water drop. That is, on the basis of the pentagon shape mentioned above, the corners of the second effective light-emitting region of the second color sub-pixel are rounded. For example, when the opening of the pixel defining layer is formed, the part at the corner of the opening may form a shape with rounded corner, so that the light-emitting region as formed may have a shape with rounded corner.

For example, as illustrated in FIG. 1A-2, the display substrate further includes a second power signal line 500 located between the first power signal line 400 and the base substrate 100, and the second power signal line 500 extends along the second direction. An orthographic projection of the second power signal sub-line 420 on the base substrate 100 at least partially overlaps with an orthographic projection of the second power signal line 500 on the base substrate 100, and the orthographic projections of the two second effective light-emitting regions 2200 on the base substrate 100 have an overlap with the orthographic projection of the second power signal line 500 on the base substrate 100. That is, along the direction perpendicular to the base substrate 100, the fracture 421 has an overlap with the second power signal line 500. For example, the orthographic projection of the second power signal sub-line 420 on the base substrate 100 is located within the orthographic projection of the second power signal line 500 on the base substrate 100. For example, the second power signal line may substantially coincide with the part of the second power signal sub-line excluding the fracture, but the second power signal sub-line has a line width partially adjusted so as not to completely overlap with the second power signal line. For example, an overlapping area of the second power signal line and the second power signal sub-line accounts for more than 70% of the area of the second power signal line.

For example, a width of the second power signal sub-line 420 in the first direction is slightly different at different positions in an extending direction of the second power signal sub-line 420, for example, the width of the second power signal sub-line 420 decreases at positions corresponding to sub-pixels of certain color(s). Similarly, a width of the second power signal line 500 in the first direction is slightly different at different positions in an extending direction of the second power signal line 500.

For example, as illustrated in FIGS. 1A-1B, two repeating units 200 located in the same repeating unit group and adjacent to each other include a first repeating unit 201 and a second repeating unit 202; the third color sub-pixel 230 of the first repeating unit 201 is adjacent to the first color sub-pixel 210 of the second repeating unit 202, and the repeating units 200 adjacent to both the first repeating unit 201 and the second repeating unit 202 and located in adjacent repeating unit groups are third repeating units 200. A continuous second power signal sub-line 420, i.e., a first signal sub-line 4201, is disposed between the first color sub-pixel 210 in the third repeating unit 203 and the third color sub-pixel 230 in the first repeating unit 201. Orthographic projections of, one column of first color sub-pixels 210 and one column of third color sub-pixels 230 located at both sides of the continuous second power signal sub-line 420 and immediately adjacent to the second power signal sub-line 420, on the second power signal sub-line 420, are arranged alternately along the second direction. A width of the second power signal sub-line 420 at a position of an orthographic projection of the first color sub-pixel 210 on the continuous second power signal sub-line 420 is a first width; a width of the second power signal sub-line 420 at a position of an interval between orthographic projections of the first color sub-pixel 210 and the third color sub-pixel 230 on the second power signal sub-line 420 is a second width; a width of the second power signal sub-line 420 at a position of an orthographic projection of the third color sub-pixel 230 on the continuous second power signal sub-line 420 is a third width; the first width is smaller than the second width, and the third width is smaller than the second width. The first width and the third width may be the same or different, for example, the third width is smaller than the first width. The continuous second power signal sub-line 420 includes: a first segment and a second segment corresponding to the first color sub-pixel 210 and the third color sub-pixel 230, respectively; and a connecting segment connecting the first segment and the second segment. Along the second direction, the first segment and the second segment of the continuous second power signal sub-line 420 are alternately arranged. An edge of the first segment away from a first center line of the corresponding first color sub-pixel 210 and an edge of the connecting segment away from the first center line are located on the same straight line extending along the second direction; and a distance between an edge of the first segment close to the first center line of the corresponding first color sub-pixel 201 and the first center line is greater than a distance between an edge of the connecting segment close to the first center line and the first center line. Similarly, an edge of the second segment away from a third center line of the corresponding third color sub-pixel and an edge of the connecting segment away from the third center line are located on the same straight line extending along the second direction; and a distance between an edge of the second segment close to the third center line of the corresponding third color sub-pixel and the third center line is greater than a distance between an edge of the connecting segment close to the third center line and the third center line. That is to say, the first segment and the connecting segments at both sides of the first segment form a first concave part which is concaved facing the first color sub-pixel; and the second segment and the connecting segments at both sides of the second segment form a second concave part which is concaved facing the third color sub-pixel. The arrangement of the first concave part and the second concave part can prevent the first effective light-emitting region and the third effective light-emitting region from overlapping with the second power signal sub-line so as to reduce the color deviation.

For example, a second power signal sub-line 420 including a fracture, that is, a second signal sub-line 4202, is disposed between the third color sub-pixel 230 in the first repeating unit 201 and the first color sub-pixel 210 in the third repeating unit 203. For example, the first signal sub-lines 4201 and the second signal sub-lines 4202 are alternately arranged along the first direction; and the number of the first signal sub-lines 4201 and the number of the second signal sub-lines 4202 are substantially the same. For example, the second signal sub-line 4202 includes a plurality of signal line segments disconnected from each other, and each of the signal line segments can be electrically connected with the second power signal line through a via hole located in an insulating layer between the second power signal line and the second signal sub-line.

For example, the second power signal sub-line 420 between two adjacent fractures arranged along the second direction (signal line segment) includes a third segment, a fourth segment and a fifth segment connected in sequence along the second direction. Along the first direction, a width of the third segment may be substantially the same with that of the fifth segment, and both the width of the third segment and the width of the fifth segment are larger than that of the fourth segment. Thus, the third segment, the fourth segment and the fifth segment form a third concave part which is concaved facing the first color sub-pixel 210 in the second repeating unit 202. An orthographic projection of the fourth segment on the base substrate falls into an orthographic projection of the second power signal line on the base substrate, so as to prevent from affecting the light transmittance of the display substrate. The fourth segment of the second power signal sub-line is electrically connected with the first power signal sub-line.

Similarly, the second power signal line 500 also has the same characteristic(s) as the second power signal sub-line, which will not be repeated here.

For example, an orthographic projection of the first effective light-emitting region 2100 of the first color sub-pixel 210 on the second signal sub-line 4202 has no overlap with the fracture 421, that is, the orthographic projection of the first effective light-emitting region 2100 of the first color sub-pixel 210 on the second signal sub-line 4202 falls within the signal line segment. For example, an orthographic projection of the third effective light-emitting region 2300 of the third color sub-pixel 230 on the second signal sub-line 4202 has no overlap with the fracture 421, that is, the orthographic projection of the third effective light-emitting region 2300 of the third color sub-pixel 230 on the second signal sub-line 4202 falls within the signal line segment.

For example, the width of the first segment of the second power signal sub-line 420 along the first direction may be 2.5 microns to 3.7 microns, and the width of the connecting segment of the second power signal sub-line 420 along the first direction may be 5.8 microns to 7 microns. For example, the distance between the edge of the connecting segment of one of the two second power signal sub-lines 420 located at both sides of the third color sub-pixel 230 and immediately adjacent to the third color sub-pixel 230, and, the edge of the third segment of the other one of the two second power signal sub-lines 420, that are close to each other, is approximately 23.4 microns to 26 microns.

For example, some areas of the second power signal sub-line 420 and the second power signal line 500 have substantially the same width in the first direction and almost completely overlap with each other. For example, both edges of the fracture are located in the area where the second power signal sub-line 420 and the second power signal line 500 almost completely overlap with each other. For example, a distance (i.e., a length of one signal line segment) between edges of two adjacent fractures arranged along the second direction is larger than a size of one pixel circuit in the second direction. For example, a size of each fracture along the second direction is smaller than a size of one pixel circuit in the second direction. For example, a distance (i.e., a length of one signal line segment) between edges of two adjacent fractures arranged along the second direction is approximately 69 microns to 75 microns. For example, the size of the pixel circuit in the second direction is approximately 63 microns to 65 microns. For example, the size of the fracture along the second direction is approximately 52 microns to 57 microns. For example, a ratio of the size of the fracture along the second direction to the size of one pixel circuit in the second direction is 0.8 to 0.9. For example, a ratio of the distance between the edges of two adjacent fractures arranged along the second direction (i.e., the length of a signal line segment) that are close to each other to the size of one pixel circuit in the second direction is 1.1-1.2.

For example, as illustrated in FIGS. 1A-1B, one half of a difference between the size D3 of the fracture 421 along the second direction, and, a sum D2 of the size of the two second effective light-emitting regions 2200 and the size of the interval S located in the fracture 421 along the second direction, can be D1 of 1.8 microns to 6.5 microns. For example, a ratio of the size D3 of the fracture 421 along the second direction to a sum D2 of the size of the two second effective light-emitting regions 2200 and the size of the interval S located in the fracture 421 can be 1.07-1.25.

For example, as illustrated in FIGS. 1A-2, a first planarization layer 121 is disposed between the first power signal line 400 and the second electrode of each sub-pixel to achieve planarization. A second planarization layer 122 and a passivation layer 123 are disposed between the first power signal line 400 and the second power signal line 500 to achieve planarization. The embodiment of the present disclosure is not limited to providing the second planarization layer 122 and the passivation layer 123 between the first power signal line 400 and the second power signal line 500, but may only provide the second planarization layer 122 without providing the passivation layer 123.

For example, as illustrated in FIGS. 1A-2, two centers of the two orthographic projections of the two second effective light-emitting regions 2200 on the base substrate 100 are located in the orthographic projection of the second power signal line 500 on the base substrate 100. In the direction perpendicular to the base substrate 100, although the second effective light-emitting region 2200 has an overlap with the second power signal line 500, the second power signal line 500 passes through the centers of the two second effective light-emitting regions, which can ensure that the second effective light-emitting region 2200 has better symmetry along the first direction, so as to mitigate the color deviation.

For example, as illustrated in FIGS. 1A and 1B, a distance between adjacent second power signal sub-lines 420 along the first direction is larger than a size of the first effective light-emitting region 2100 along the first direction; and the first effective light-emitting region 2100 is located between adjacent second power signal sub-lines 420. Similarly, the first effective light-emitting region 2100 is located between adjacent second power signal lines 500. In the embodiment of the present disclosure, a size of the first effective light-emitting region of the first color sub-pixel is smaller than a distance between two adjacent second power signal sub-lines. By arranging the first effective light-emitting region between adjacent second power signal sub-lines, it can prevent the first effective light-emitting region from overlapping with the second power signal sub-line and the second power line, improve the flatness of the film layer in the first effective light-emitting region, enhance the symmetry of the first effective light-emitting region in the first direction, and facilitate mitigating the color deviation.

For example, as illustrated in FIGS. 1A and 1B, a distance between adjacent second power signal sub-lines 420 along the first direction is larger than a size of the third effective light-emitting region 2300 along the first direction; and the third effective light-emitting region 2300 is located between adjacent second power signal sub-lines 420. For example, a width of the second power signal sub-line 420 at a position corresponding to the third color sub-pixel 230 is reduced, so that a distance between the edges (corresponding to the two edges at the position of the third effective light-emitting region) of the adjacent second power signal sub-lines 420 close to each other along the first direction is larger than a size of the third effective light-emitting region 2300 along the first direction. Similarly, the third effective light-emitting region 2300 is located between adjacent second power signal lines 500. In the embodiment of the present disclosure, the size of the third effective light-emitting region of the third color sub-pixel is smaller than the distance between two adjacent second power signal sub-lines. By arranging the third effective light-emitting region between adjacent second power signal sub-lines, it can prevent the third effective light-emitting region from overlapping with the second power signal sub-line and the second power line, improve the flatness of the film layer in the third effective light-emitting region, enhance the symmetry of the third effective light-emitting region in the first direction, and facilitate mitigating the color deviation.

For example, the orthographic projection of the second electrode of the third color sub-pixel 230 on the base substrate 100 barely overlaps with the second power signal sub-line 420. For example, the width of the second power signal sub-line 420 at the position corresponding to the third color sub-pixel 230 is reduced, so that the distance between the edges (corresponding to the two edges at the position of the second electrode of the third color sub-pixel) of the adjacent second power signal sub-lines 420 close to each other along the first direction is larger than the size of the second electrode of the third color sub-pixel 230 along the first direction.

For example, as illustrated in FIGS. 1A and 1B, one second power signal sub-line 420 is disposed between effective light-emitting regions of two adjacent sub-pixels arranged along the first direction. That is, one second power signal sub-line 420 is disposed between the first effective light-emitting region 2100 and the second effective light-emitting region 2200; one second power signal sub-line 420 is disposed between the second effective light-emitting region 2200 and the third effective light-emitting region 2300; and one second power signal sub-line 420 is disposed between the third effective light-emitting region 2300 and the first effective light-emitting region 2100.

For example, as illustrated in FIGS. 1A and 1B, a plurality of second power signal sub-lines 420 are uniformly distributed in the first direction, that is, the plurality of second power signal sub-lines 420 are arranged at substantially equal intervals.

For example, as illustrated in FIGS. 1A and 1 B, in the first direction, a distance between sides of two second power signal sub-lines 420 located at both sides of the first effective light-emitting region 2100 and immediately adjacent to the first effective light-emitting region 2100, that are close to each other, is a first distance d1. Here, taking a distance between an edge of the first segment of the second power signal sub-line 420 located at one side of the first effective light-emitting region 2100 and an edge of the third segment of the second power signal sub-line 420 located at the other side of the first effective light-emitting region 2100 (the two edges are close to each other) as the first distance, by way of example. A distance between two second power signal sub-lines 420 located at both sides of the second effective light-emitting region 2200 and immediately adjacent to the second effective light-emitting region 2200 is a second distance d2. Here, taking a distance between an edge the first segment of the second power signal sub-line 420 located at one side of the second effective light-emitting region 2200 and an edge of the second segment of the second power signal sub-line 420 located at the other side of the second effective light-emitting region 220 (the two edges are close to each other) as the second distance, by way of example. A distance between two second power signal sub-lines 420 located at both sides of the third effective light-emitting region 2300 and immediately adjacent to the third effective light-emitting region 2300 is a third distance d3. Here, taking a distance between an edge of the second segment of the second power signal sub-line 420 located at one side of the third effective light-emitting region 2300 and an edge of the third segment of the second power signal sub-line 420 located at the other side of the third effective light-emitting region 2300 (the two edges are close to each other) as the third distance, by way of example. A ratio of the first distance to the third distance is 0.9-1.1, for example, the first distance is approximately equal to the third distance, and the second distance is approximately twice the first distance. The above-mentioned second power signal sub-lines located at both sides of the effective light-emitting region and immediately adjacent to the effective light-emitting region refer to that, along the first direction, there are no other second power signal sub-lines between the second power signal sub-lines and the effective light-emitting region.

For example, as illustrated in FIGS. 1A and 1B, a ratio of distances from the two second power signal sub-lines 420 located at both sides of the second color sub-pixel pair 220 and immediately adjacent to the second color sub-pixel pair 220 to the second center line extending in the second direction of the second effective light-emitting region 2200 of the second color sub-pixel pair 220 is 0.9-1.1. For example, the two second power signal sub-lines 420 located at both sides of the second color sub-pixel pair 220 and immediately adjacent to the second color sub-pixel pair 220 have substantially the same distance from the second center line extending in the second direction of the second effective light-emitting region 2200 of the second color sub-pixel pair 220. Therefore, the two second power signal sub-lines 420 located at both sides of the second effective light-emitting region 2200 and immediately adjacent to the second effective light-emitting region 2200 are almost symmetrically distributed with respect to the second center line, thereby ensuring the symmetry of the second electrodes of the second color sub-pixel pair in the first direction to mitigate the color deviation.

For example, as illustrated in FIGS. 1A and 1B, a ratio of distances from the two second power signal sub-lines 420 located at both sides of the third color sub-pixel 230 and immediately adjacent to the third color sub-pixel 230 to the third center line extending in the second direction of the third effective light-emitting region 2300 of the third color sub-pixel 230 is 0.9-1.1. For example, the two second power signal sub-lines 420 located at both sides of the third color sub-pixel 230 and immediately adjacent to the third color sub-pixel 230 have substantially the same distance from the third center line extending in the second direction of the third effective light-emitting region 2300 of the third color sub-pixel 230. Here, the distance from the second power signal sub-lines 420 located at both sides of the third color sub-pixel 230 to the third center line may refer to the distance from the third center line to the edges of the second power signal sub-lines 420 close to the third center line, and the width of the second power signal sub-line 420 at one side of the third color sub-pixel 230 is narrow at the position corresponding to the third color sub-pixel 230. This position is the second segment of the second power signal sub-line 420, which forms a second concave part with the connecting segment so that the edges (close to each other) of the two second power signal sub-lines 420 located at both sides of the third color sub-pixel 230 and immediately adjacent to the third color sub-pixel 230 have substantially the same distance from the third center line extending in the second direction of the third effective light-emitting region 2300 of the third color sub-pixel 230. The two second power signal sub-lines 420 located at both sides of the third effective light-emitting region 2300 and immediately adjacent to the third effective light-emitting region 2300 are substantially symmetrically distributed with respect to the third center line, thereby ensuring the symmetry of the second electrode of the third color sub-pixel in the first direction to mitigate the color deviation.

For example, as illustrated in FIGS. 1A and 1B, the two second power signal sub-lines 420 located at both sides of the first color sub-pixel 210 and immediately adjacent to the first color sub-pixel 210 have different distances from the first center line extending in the second direction of the first effective light-emitting region 2100 of the first color sub-pixel 210. That is, the two second power signal sub-lines 420 located at both sides of the first effective light-emitting region 2100 and immediately adjacent to the first effective light-emitting region 2100 are asymmetrically distributed with respect to the first center line. For example, the distance between the first center line and the edge of the second power signal sub-line 420 located between the first effective light-emitting region 2100 and the second effective light-emitting region 2200 close to the first center line is a fourth distance. Here, taking the distance between the first center line and the edge, close to the first center line, of the first segment of the second power signal sub-line 420 located between the first effective light-emitting region 2100 and the second effective light-emitting region 2200 in the first repeating unit 201 as the fourth distance, by way of example. The distance between the first center line and the second power signal sub-line 420 located between the first effective light-emitting region 2100 and the third effective light-emitting region 2300 is a fifth distance, and the fifth distance is greater than the fourth distance. Here, taking the distance between the first center line and the edge, close to the first center line, of the third segment of the second power signal sub-line 420 located between the third effective light-emitting region 2300 in the first repeating unit 201 and the first effective light-emitting region 2100 in the second repeating unit 202 as the fifth distance, by way of example.

For example, as illustrated in FIGS. 1A and 1B, the distance between the edge of the second effective light-emitting region 2200 and the edge of the immediately adjacent second power signal sub-line 420 (the two edges are opposite to each other) is greater than the distance between the edge of the first effective light-emitting region 2100 and the edge of the immediately adjacent second power signal sub-line 420 (the two edges are opposite to each other).

For example, as illustrated in FIGS. 1A and 1B, the intervals (PDL gap) among boundaries of light-emitting regions of sub-pixels of different colors are substantially the same, that is, a ratio of the distance between the edges of the first effective light-emitting region 2100 and the second effective light-emitting region 2200 that are close to each other, to the distance between the edges of the second effective light-emitting region 2200 and the third effective light-emitting region 2300 that are close to each other is, for example, 0.9-1.1. For example, the distance between the edges of the first effective light-emitting region 2100 and the second effective light-emitting region 2200 that are close to each other is approximately equal to the distance between the edges of the second effective light-emitting region 2200 and the third effective light-emitting region 2300 that are close to each other. Therefore, the distance between the first center line and the second power signal sub-line located between the first effective light-emitting region and the second effective light-emitting region is smaller than the distance between the first center line and the second power signal sub-line located between the first effective light-emitting region and the third effective light-emitting region.

For example, as illustrated in FIGS. 1A and 1B, the display substrate further includes a plurality of pads 430 arranged in the same layer as the first power signal line 400, the pad 430 extends along the second direction, and the first effective light-emitting region 2100 is located between the pad 430 and the second power signal sub-line 420 closer to the first center line (among the second power signal sub-lines 420 immediately adjacent to the first effective light-emitting region 2100). For example, a distance between an edge of the pad 430 close to the first center line and the first centerline of the first effective light-emitting region 2100 is a sixth distance, which is smaller than the fifth distance. According to the embodiment of the present disclosure, the pad is disposed at one side of the first effective light-emitting region, which is beneficial to improving the symmetry of the second electrode of the first color sub-pixel in the first direction, so as to mitigate the color deviation.

For example, a ratio of the sixth distance to the fourth distance can be 0.9-1.1 so as to further improve the symmetry of the second electrode of the first color sub-pixel in the first direction.

For example, along a direction perpendicular to the base substrate, the pad 430 has no overlap with the first effective light-emitting region 2100, so as to prevent from affecting the displaying effect of the first color sub-pixel.

For example, along a direction perpendicular to the base substrate, the pad 430 has no overlap with the second power signal sub-line 420 at one side of the first effective light-emitting region 2100 away from the pad 430.

For example, along the direction perpendicular to the base substrate, the pad 430 has no overlap with the second electrode of the first color sub-pixel, or an overlapping area therebetween is small, which is beneficial to mitigating the color deviation.

For example, as illustrated in FIGS. 1A and 1B, the pad 430 is located at one side of the second power signal sub-line 420 disposed between the first color sub-pixel 210 and the third color sub-pixel 230 close to the first color sub-pixel 410. According to the embodiment of the present disclosure, the pad can reduce the distance from the first center line to a film layer pattern, where the first power signal line is located, at one side of the first effective light-emitting region away from the second effective light-emitting region, which is beneficial to improving the symmetry of the second electrode of the first color sub-pixel in the first direction, so as to mitigate the color deviation. For example, the pad 430 can be integrated with the first power signal line disposed at a side of the first effective light-emitting region away from the second effective light-emitting region, which is equivalent to widening the first power signal line in the first direction in an area of the first power signal line close to the first color sub-pixel 210, so that two side edges of the first effective light-emitting region of the first color sub-pixel 210 have substantially the same distance from the film layer pattern where the first power signal line is located, in order to mitigate the color deviation. For example, a part where a first pad 430 is connected with the first power signal line can be a solid structure. For example, the part where the first pad 430 is connected with the first power signal line can be configured as a hollow structure, that is, a part of the pattern between the first pad 430 and the first power signal line may be removed, so as to reduce a parasitic capacitance or a transistor load of the part of the pattern overlapped with this region, or to improve the transmittance. For example, a line width of the first pad 430 close to the first color sub-pixel is not larger than a line width of the first power signal line close to the first color sub-pixel.

For example, a length of the first effective light-emitting region of the first color sub-pixel along the second direction is larger than its width along the first direction, and a length direction of the first effective light-emitting region is consistent with an extending direction of the second power signal sub-line, thus a pad extending in the second direction is disposed at one side of the first effective light-emitting region along the first direction. For example, a length of the third effective light-emitting region of the third color sub-pixel along the second direction is greater than its width along the first direction, and an aspect ratio of the first effective light-emitting region is greater than that of the third effective light-emitting region. Therefore, a significant difference in distances from the first center line of the first effective light-emitting region to the two second power signal sub-lines located at both sides of the first effective light-emitting region and immediately adjacent to the first effective light-emitting region may be occurred, and the color deviation can be mitigated by arranging the above-mentioned pad at one side of the first effective light-emitting region.

For example, as illustrated in FIGS. 1A and 1B, in the first direction, the second power signal sub-line 420 and the pads 430 located at both sides of the first effective light-emitting region 2100 have substantially the same distance from a center line of the first effective light-emitting region 2100. That is, the second power signal sub-line and the pads 430 located at both sides of the first center line have substantially the same distance from the first center line, so that the symmetry of the second electrode of the first color sub-pixel in the first direction can be further improved, which is beneficial to improving the color deviation.

For example, as illustrated in FIGS. 1A and 1B, the pad 430 is electrically connected with the first power signal line 400 to prevent from a floating state of the pad 430 which may affect the normal operation of the organic light-emitting element.

For example, as illustrated in FIGS. 1A and 1B, along the direction perpendicular to the base substrate 100, the pad 430 has an overlap with the first power signal sub-line 410 and is electrically connected with the first power signal sub-line 410, and the first power signal sub-line 410 provides an electrical signal for the pad 430. For example, the first power signal sub-line 410 may be integrally formed with the pad 430 to save the processing steps.

For example, the pad 430 has an approximately strip shape, and a center of an orthographic projection of the pad 430 on the base substrate 100 is located within the orthographic projection of the first power signal sub-line 410 on the base substrate 100.

For example, as illustrated in FIGS. 1A and 1B, the size of the pad 430 in the second direction is larger than that in the first direction. Along the second direction, the size of the pad 430 is smaller than that of the first effective light-emitting region 2100. When the display substrate in the embodiment of the present disclosure is applied to perform an in-screen fingerprint detection, the size of the pad along the second direction is designed to be smaller than the size of the first effective light-emitting region. For example, the pad has no overlap with the light-transmitting area (described later), as far as possible, which is beneficial to improving the light transmittance of the display substrate.

For example, as illustrated in FIGS. 1A and 1B, the display substrate further includes a connecting part 440 disposed in the same layer as the pad 430. The pad 430 is spaced apart from the second signal sub-line 4202; the connecting part 440 is located between the second power signal sub-line 420 (i.e., the second signal sub-line 4202) and the pad 430; and the pad 430 is connected to the second power signal sub-line 420 through the connecting part 440.

For example, a size of the connecting part 440 along the second direction may be 36 microns to 40 microns, for example, 38 microns. For example, along the second direction, a size of the connecting part 440 is smaller than a size of the first effective light-emitting region 2100 and a size of the third effective light-emitting region 2300.

For example, an orthographic projection of the connecting part 440 on a straight line extending along the second direction may be located within an orthographic projection of the third effective light-emitting region 2300 on the straight line.

For example, orthographic projections of the pad 430 and of the connecting part 440 on a straight line extending along the second direction both are located in an orthographic projection of the third effective light-emitting region 2300 on the straight line.

For example, a size of the pad 430 in the second direction is smaller than a size of the third effective light-emitting region 2300 in the second direction.

For example, a distance between an edge of the second power signal sub-line 420 located between the connecting part 440 and the third color sub-pixel 230 and an edge of the pad 430 (the two edges are close to each other) may be 11 microns to 13 microns, for example, 12 microns.

For example, the connecting part 440, the pad 430, and the second power signal sub-line 420 form an annular structure.

For example, as illustrated in FIGS. 1A and 1B, the connecting part 440 includes two connecting sub-parts, and both ends of the pad 430 are electrically connected with the second power signal sub-line 420 through the two connecting sub-parts. The connecting part, the pad and the second power signal sub-line connected with the connecting part provided by the embodiment of the present disclosure form an annular loop, which is beneficial to the uniformity of the first color sub-pixel.

For example, a size of each of the connecting sub-parts along the second direction may be 2.5 microns to 3.5 microns, for example, 3 microns. A distance between edges of the two connecting sub-parts close to each other may be 32 microns.

For example, the connecting part 440, the pad 430 and the second power signal sub-line 420 are integrally provided to save processing steps.

For example, the pad 430 is connected to the second signal sub-line 4202 through the connecting part 440, and an orthographic projection of the pad 430 on another second signal sub-line 4202 adjacent to said second signal sub-line 4202 connected to the pad 430 is located in the fracture 421 of said another second signal sub-line 4202.

For example, when the display substrate in the embodiment of the present disclosure is applied to perform in-screen fingerprint detection, the connecting part has no overlap with a transparent region (described later), which can ensure that the light transmittance of the display substrate is not affected.

Figure 3A:
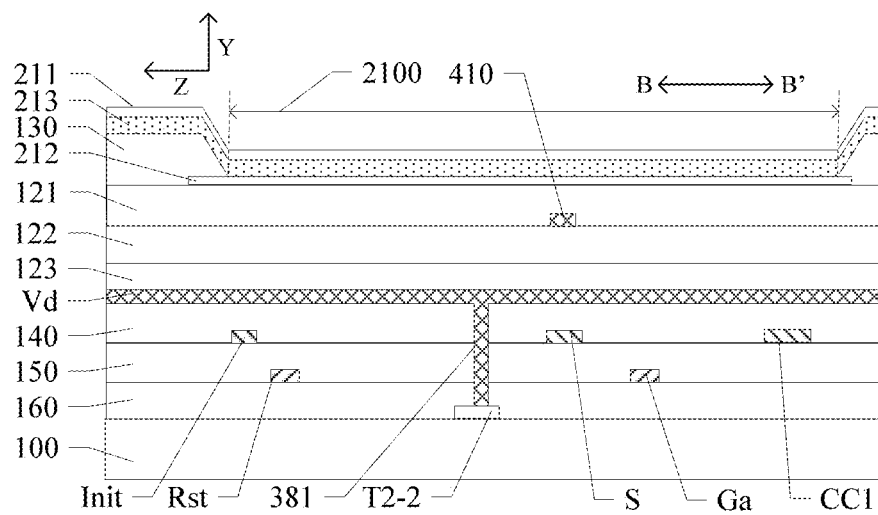
FIG. 3A is a schematic diagram of a partial cross-sectional structure taken along BB' line illustrated in FIGS. 1A and 1B.
Figure 3B:
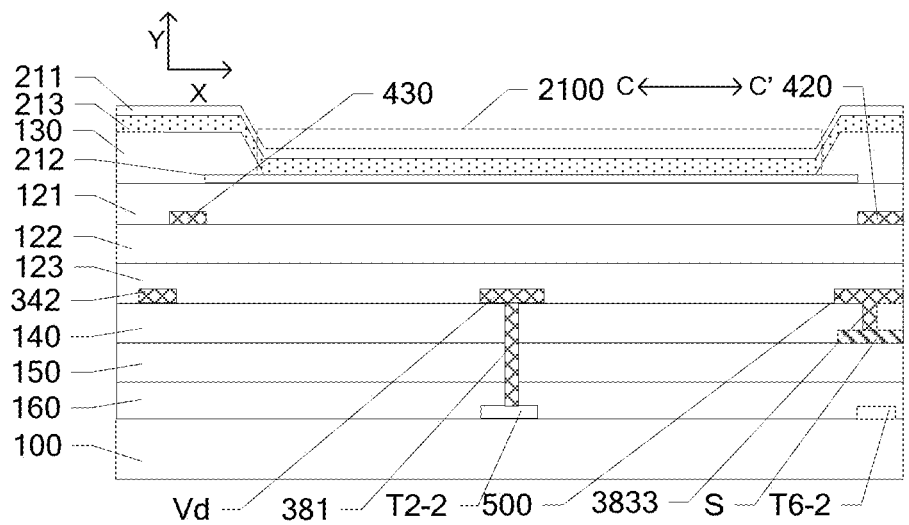
FIG. 3B is a schematic diagram of a partial cross-sectional structure taken along CC' line illustrated in FIG. 1B.

For example, FIG. 3A is a schematic diagram of a partial cross-sectional structure taken along BB' line illustrated in FIGS. 1A and 1B, and FIG. 3B is a schematic diagram of a partial cross-sectional structure taken along CC' line illustrated in FIG. 1B. As illustrated in FIGS. 1A-3B, in the direction perpendicular to the base substrate 100, the first effective light-emitting region 2100 has no overlap with the second power signal sub-line 420 and the second power signal line 500, thus ensuring that the first effective light-emitting region has better symmetry along the first direction so as to mitigate the color deviation. Similarly, in the direction perpendicular to the base substrate 100, the third effective light-emitting region 2300 has no overlap with the second power signal sub-line 420 and the second power signal line 500, thus ensuring that the third effective light-emitting region has better symmetry along the first direction.

For example, as illustrated in FIGS. 1A-3B, the first center line of the first effective light-emitting region 2100 has an overlap with a data line Vd (described later), thus ensuring that the first effective light-emitting region has good symmetry along the first direction. For example, the data line Vd penetrates through the first effective light-emitting region 2100 along the second direction, so that the first effective light-emitting region 2100 has certain uniformity along the second direction. In the embodiment of the present disclosure, "penetrate(s)/penetrating through" refers to positional relationships between the effective light-emitting region and the structures such as the data line and the first power signal line on a plane.

For example, as illustrated in FIGS. 1A and 1B, the shape of the first effective light-emitting region 2100 of the first color sub-pixel 210 and the shape of the third effective light-emitting region 2300 of the third color sub-pixel 230 each include a hexagon or an ellipse. For example, the shape of the first effective light-emitting region 2100 and the shape of the third effective light-emitting region 2300 both are hexagons, three pairs of opposite sides in the hexagon are parallel in each pair, and the hexagon also includes sides parallel to the second direction. The hexagon includes a symmetry axis extending in the first direction and a symmetry axis extending in the second direction.

Although the shapes of the first and third effective light-emitting regions illustrated in FIG. 1A include an angle strictly formed by two line segments, in some embodiments, the shapes of the first and third effective light-emitting regions may be patterns with rounded corners, such as an ellipse. That is, on the basis of the hexagon, the corners of the first effective light-emitting region and the third effective light-emitting region are rounded. For example, when the opening of the pixel defining layer is formed, the corners of the opening may form rounded corners, so that the shapes of the first effective light-emitting region and the third effective light-emitting region may be shapes with rounded corners.

For example, as illustrated in FIGS. 1A-3B, a center of an orthographic projection of the first effective light-emitting region 2100 on the base substrate 100 is located within an orthographic projection of the first power signal sub-line 410 on the base substrate 100. For example, the orthographic projection of the first power signal sub-line 410 on the base substrate 100 passes through the center of the orthographic projection of the first effective light-emitting region 2100 on the base substrate 100. That is, in a plan view, the first effective light-emitting region 2100 is symmetrically distributed with respect to the first power signal sub-line 410, that is, the first power signal sub-line 410 coincides with the symmetry axis extending along the first direction of the first effective light-emitting region 2100, which can ensure that the first effective light-emitting region 2100 has better symmetry along the second direction to mitigate the color deviation.

For example, as illustrated in FIGS. 1A-3B, a center of an orthographic projection of the third effective light-emitting region 2300 on the base substrate 100 is located within an orthographic projection of the first power signal sub-line 410 on the base substrate 100. For example, the orthographic projection of the first power signal sub-line 410 on the base substrate 100 passes through the center of the orthographic projection of the third effective light-emitting region 2300 on the base substrate 100. That is, in a plan view, the third effective light-emitting region 2300 is substantially, symmetrically distributed with respect to the first power signal sub-line 410, that is, the symmetry axis of the third effective light-emitting regions 2300 extending along the first direction falls within the first power signal sub-line 410, which can ensure that the third effective light-emitting region 2300 has better symmetry along the second direction to mitigate the color deviation.

Figure 4:
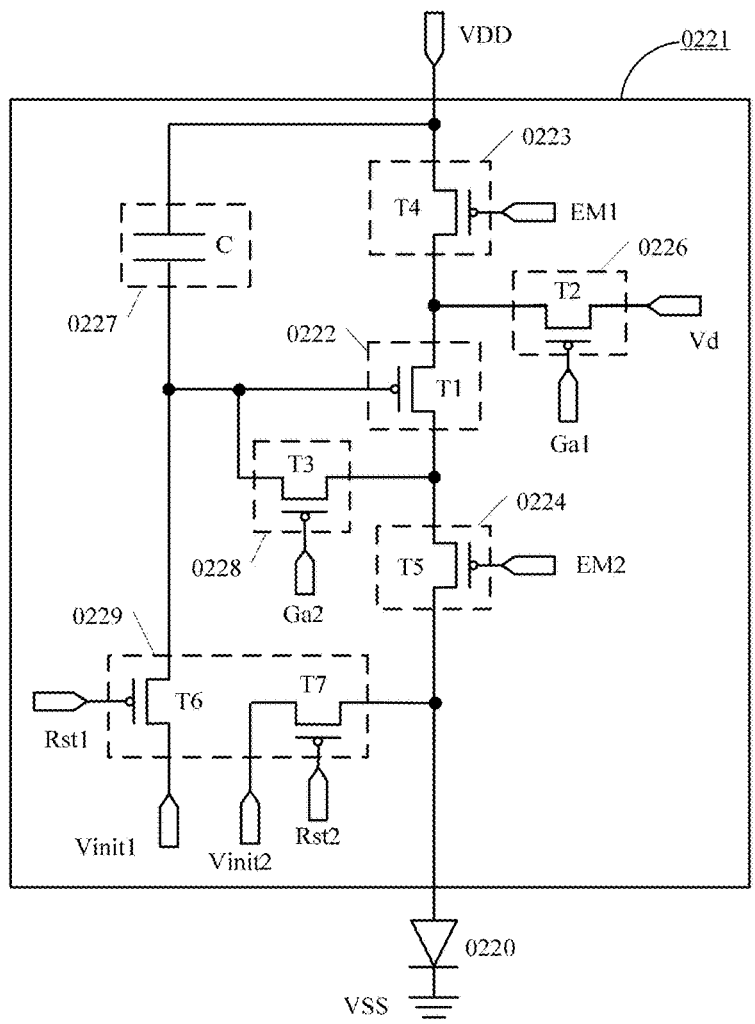
FIG. 4 is a schematic diagram of a pixel circuit which is included in each sub-pixel and is connected to an organic light-emitting element.

For example, FIG. 4 is a schematic diagram of a pixel circuit which is included in each sub-pixel and is connected to an organic light-emitting element. As illustrated in FIG. 4, each sub-pixel also includes a pixel circuit 0221 for driving the organic light-emitting element to emit light. The pixel circuit 0221 may include a driving circuit 0222, a first light-emitting control circuit 0223, a second light-emitting control circuit 0224, a data writing circuit 0226, a storage circuit 0227, a threshold compensation circuit 0228 and a reset circuit 0229. The driving circuit 0222 includes a control terminal, a first terminal and a second terminal, and is configured to provide a driving current to the organic light-emitting element 0220 for driving the organic light-emitting element 0220 to emit light.

For example, the first light-emitting control circuit 0223 is electrically connected with a first voltage terminal VDD and the first terminal of the driving circuit 0222, and is configured to turn on or off a connection between the driving circuit 0222 and the first voltage terminal VDD. The second light-emitting control circuit 0224 is electrically connected with the second terminal of the driving circuit 0222 and the first electrode of the organic light-emitting element 0220, and is configured to turn on or off a connection between the driving circuit 0222 and the organic light-emitting element 0220. The data writing circuit 0226 is electrically connected with the first terminal of the driving circuit 0222, and is configured to write a data signal into the storage circuit 0227 under the control of a scanning signal. The storage circuit 0227 is electrically connected with the control terminal of the driving circuit 0222 and the first voltage terminal VDD, and is configured to store the data signal. The threshold compensation circuit 0228 is electrically connected with the control terminal and the second terminal of the driving circuit 0222, and is configured to perform threshold compensation on the driving circuit 0222. The reset circuit 0229 is electrically connected with the control terminal of the driving circuit 0222 and the first electrode of the organic light-emitting element 0220, and is configured to reset the control terminal of the driving circuit 0222 and the first electrode of the organic light-emitting element 0220 under the control of a reset control signal.

For example, as illustrated in FIG. 4, the driving circuit 0222 includes a driving transistor T1, the control terminal of the driving circuit 0222 includes a gate of the driving transistor T1, the first terminal of the driving circuit 0222 includes a first electrode of the driving transistor T1, and the second terminal of the driving circuit 0222 includes a second electrode of the driving transistor T1. The data writing circuit 0226 includes a data writing transistor T2, the storage circuit 0227 includes a capacitor C, the threshold compensation circuit 0228 includes a threshold compensation transistor T3, the first light-emitting control circuit 0223 includes a first light-emitting control transistor T4, the second light-emitting control circuit 0224 includes a second light-emitting control transistor T5, the reset circuit 0229 includes a first reset transistor T6 and a second reset transistor T7, and the reset control signal may include a first reset control sub-signal and a second reset control sub-signal.

For example, as illustrated in FIG. 4, a first electrode of the data writing transistor T2 is electrically connected with the first electrode of the driving transistor T1, a second electrode of the data writing transistor T2 is configured to be electrically connected with the data line Vd to receive the data signal, and a gate of the data writing transistor T2 is configured to be electrically connected with a first scanning signal line Ga1 to receive the scanning signal; a first electrode of the capacitor C is electrically connected with the first voltage terminal VDD, and a second electrode of the capacitor C is electrically connected with the gate of the driving transistor T1; a first electrode of the threshold compensation transistor T3 is electrically connected with the second electrode of the driving transistor T1, a second electrode of the threshold compensation transistor T3 is electrically connected with the gate of the driving transistor T1, and a gate of the threshold compensation transistor T3 is configured to be electrically connected with a second scanning signal line Ga2 to receive a compensation control signal; a first electrode of the first reset transistor T6 is configured to be electrically connected with a first reset voltage terminal Vinit1 to receive a first reset signal, a second electrode of the first reset transistor T6 is electrically connected with the gate of the driving transistor T1, and a gate of the first reset transistor T6 is configured to be electrically connected with a first reset control signal line Rst1 to receive a first reset control sub-signal; a first electrode of the second reset transistor T7 is configured to be electrically connected with a second reset voltage terminal Vinit2 to receive a second reset signal, a second electrode of the second reset transistor T7 is electrically connected with the first electrode of the organic light-emitting element 0220, and a gate of the second reset transistor T7 is configured to be electrically connected with a second reset control signal line Rst2 to receive a second reset control sub-signal; a first electrode of the first light-emitting control transistor T4 is electrically connected with the first voltage terminal VDD, a second electrode of the first light-emitting control transistor T4 is electrically connected with the first electrode of the driving transistor T1, and a gate of the first light-emitting control transistor T4 is configured to be electrically connected with a first light-emitting control signal line EM1 to receive a first light-emitting control signal; a first electrode of the second light-emitting control transistor T5 is electrically connected with the second electrode of the driving transistor T1, a second electrode of the second light-emitting control transistor T5 is electrically connected with the second electrode of the organic light-emitting element 0220, a gate of the second light-emitting control transistor T5 is configured to be electrically connected with a second light-emitting control signal line EM2 to receive a second light-emitting control signal; the first electrode of the organic light-emitting element 0220 is electrically connected to a second voltage terminal VSS.

For example, one of the first voltage terminal VDD and the second voltage terminal VSS is a high voltage terminal, and the other is a low voltage terminal. For example, in the embodiment illustrated in FIG. 4, the first voltage terminal VDD is a voltage source to output a constant first voltage which is a positive voltage; and the second voltage terminal VSS can be a voltage source to output a constant second voltage, which is a negative voltage, etc. For example, in some examples, the second voltage terminal VSS may be grounded.

For example, as illustrated in FIG. 4, the scanning signal and the compensation control signal may be the same signal, that is, the gate of the data writing transistor T2 and the gate of the threshold compensation transistor T3 may be electrically connected to the same signal line, such as the first scanning signal line Ga1, to receive the same signal (e.g., scanning signal). At this time, the display substrate may not be provided with the second scanning signal line Ga2, and the number of the signal lines may be reduced. For another example, the gate of the data writing transistor T2 and the gate of the threshold compensation transistor T3 may also be electrically connected to different signal lines respectively, that is, the gate of the data writing transistor T2 is electrically connected to the first scanning signal line Ga1, and the gate of the threshold compensation transistor T3 is electrically connected to the second scanning signal line Ga2, and the signal transmitted by the first scanning signal line Ga1 and the signal transmitted by the second scanning signal line Ga2 are the same signal.

It should be noted that, the scanning signal and the compensation control signal can also be different, so that the gate of the data writing transistor T2 and the threshold compensation transistor T3 can be controlled separately, which increases the flexibility for controlling the pixel circuit.

For example, as illustrated in FIG. 4, the first light-emitting control signal and the second light-emitting control signal may be the same signal, that is, the gate of the first light-emitting control transistor T4 and the gate of the second light-emitting control transistor T5 may be electrically connected to the same signal line, such as the first light-emitting control signal line EM1, to receive the same signal (e.g., the first light-emitting control signal). At this time, the display substrate may not be provided with the second light-emitting control signal line EM2, and the number of the signal lines may be reduced. For another example, the gate of the first light-emitting control transistor T4 and the gate of the second light-emitting control transistor T5 may also be electrically connected to different signal lines respectively, that is, the gate of the first light-emitting control transistor T4 is electrically connected to the first light-emitting control signal line EM1, and the gate of the second light-emitting control transistor T5 is electrically connected to the second light-emitting control signal line EM2, and the signal transmitted by the first light-emitting control signal line EM1 and the signal transmitted by the second light-emitting control signal line EM2 are the same signal.

It should be noted that, when the first light-emitting control transistor T4 and the second light-emitting control transistor T5 are different types of transistors, for example, when the first light-emitting control transistor T4 is a P-type transistor and the second light-emitting control transistor T5 is an N-type transistor, the first light-emitting control signal and the second light-emitting control signal may also be different, which is not limited in the embodiment of the present disclosure.

For example, the first reset control sub-signal and the second reset control sub-signal may be the same signal, that is, the gate of the first reset transistor T6 and the gate of the second reset transistor T7 may be electrically connected to the same signal line, such as the first reset control signal line Rst1, to receive the same signal (for example, the first reset control sub-signal). At this time, the display substrate may not be provided with the second reset control signal line Rst2, and the number of the signal lines may be reduced. In another example, the gate of the first reset transistor T6 and the gate of the second reset transistor T7 may also be electrically connected to different signal lines, that is, the gate of the first reset transistor T6 is electrically connected to the first reset control signal line Rst1, and the gate of the second reset transistor T7 is electrically connected to the second reset control signal line Rst2, and the signal transmitted by the first reset control signal line Rst1 and the signal transmitted by the second reset control signal line Rst2 are the same signal. It should be noted that, the first reset control sub-signal and the second reset control sub-signal may also be different signals.

For example, in some examples, the second reset control sub-signal and the scanning signal may be the same signal, that is, the gate of the second reset transistor T7 may be electrically connected to the scanning signal line Ga to receive the scanning signal as the second reset control sub-signal.

For example, a source of the first reset transistor T6 and a source of the second reset transistor T7 are connected to the first and second reset voltage terminals Vinit1 and Vinit2, respectively, which may be DC reference voltage terminals to output a constant DC reference voltage. The first reset voltage terminal Vinit1 and the second reset voltage terminal Vinit2 may be the same reset voltage terminal, for example, the source of the first reset transistor T6 and the source of the second reset transistor T7 are connected to the same reset voltage terminal. The first reset voltage terminal Vinit1 and the second reset voltage terminal Vinit2 may be high voltage terminals or low voltage terminals, as long as they can provide the first reset signal and the second reset signal to reset the gate of the driving transistor T1 and the first electrode of the light-emitting element 0220, which is not limited in the present disclosure. For example, the gate of the first reset transistor T6 and the source of the second reset transistor T7 may both be connected to a reset power signal line Init.

It should be noted that, the driving circuit 0222, the data writing circuit 0226, the storage circuit 0227, the threshold compensation circuit 0228 and the reset circuit 0229 in the pixel circuit in FIG. 4 are only illustrated by way of example. The specific structures of the driving circuit 0222, the data writing circuit 0226, the storage circuit 0227, the threshold compensation circuit 0228 and the reset circuit 0229 can be configured according to actual application demands, which are not particularly limited in the embodiments of the present disclosure.

For example, transistors can be classified as N-type transistors and P-type transistors depending on the characteristics. For the sake of clarity, the embodiments of the present disclosure particularly describe the technical solutions of the present disclosure with reference to the case where the transistors are P-type transistors (for example, P-type MOS transistors) by way of example, that is, in the description of the present disclosure, the driving transistor T1, the data writing transistor T2, the threshold compensation transistor T3, the first light-emitting control transistor T4, the second light-emitting control transistor T5, the first reset transistor T6 and the second reset transistor T7 can all be P-type transistors. However, the transistors in the embodiments of the present disclosure are not limited to P-type transistors, and those skilled in the art can also realize the functions of one or more transistors in the embodiments of the present disclosure by using N-type transistors (e.g., N-type MOS transistors) according to actual needs.

It should be noted that, the transistors adopted in the embodiments of the present disclosure can be thin film transistors, field effect transistors or other switching devices with the same characteristics, and the thin film transistors can include oxide semiconductor thin film transistors, amorphous silicon thin film transistors or polysilicon thin film transistors, etc. The source and drain of the transistor can be symmetrical in structure, so the source and drain can be indistinguishable in physical structure. In the embodiment of the present disclosure, in order to distinguish the transistor, it directly describes one of the source and the drain as the first electrode and describes the other one as the second electrode in addition to the gate used as the control electrode, so the first electrode and the second electrode of all or part of the transistors in the embodiment of the present disclosure can be interchanged as required.

It should be noted that, in the embodiment of the disclosure, the pixel circuit of a sub-pixel can be a 7T1C structure (i.e., seven transistors and one capacitor) illustrated in FIG. 4, and can also be a structure including other numbers of transistors, such as 7T2C structure, 6T1C structure, 6T2C structure or 9T2C structure, which is not limited in the embodiments of the disclosure.

Figure 5:
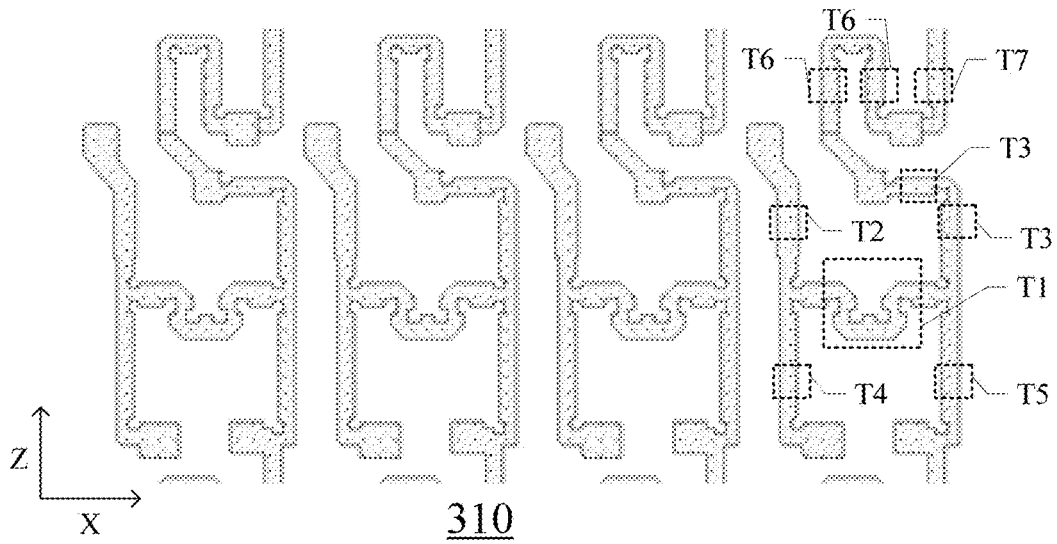
FIG. 5-FIG. 11 are schematic diagrams of a pixel circuit and a lamination of respective layers of respective signal lines provided by some embodiments of the present disclosure.

FIG. 5-FIG. 11 are schematic diagrams of a pixel circuit and a lamination of respective layers of respective signal lines provided by some embodiments of the present disclosure. Hereinafter, positional relationships among circuits and signal lines in the pixel circuit on a backplane will be described with reference to FIG. 5-FIG. 11. The example illustrated in FIG. 5-FIG. 11 is the case where four adjacent pixel circuits 0221 are included in four sub-pixels, and illustrates the positions of the transistors of the pixel circuit included in one sub-pixel, with the components included in pixel circuits of other sub-pixels being substantially the same as those of the transistors included in this sub-pixel. As illustrated in FIG. 5, the pixel circuit 0221 of this sub-pixel includes a driving transistor T1, a data writing transistor T2, a threshold compensation transistor T3, a first light-emitting control transistor T4, a second light-emitting control transistor T5, a first reset transistor T6, a second reset transistor T7, and a capacitor C as illustrated in FIG. 4.

For example, FIG. 5 illustrates an active semiconductor layer 310 of the pixel circuit in the display substrate. The active semiconductor layer 310 may be patterned using a semiconductor material. The active semiconductor layer 310 can be used to fabricate active layers of the above-mentioned driving transistor T1, data writing transistor T2, threshold compensation transistor T3, first light-emitting control transistor T4, second light-emitting control transistor T5, first reset transistor T6 and second reset transistor T7. The active semiconductor layer 310 includes active layer patterns (channel regions) and doped region patterns (source/drain doped regions) of transistors in each sub-pixel, and the active layer patterns and doped region patterns of the transistors in the same pixel circuit are integrally provided.

It should be noted that, the active layer may include an integrally formed low-temperature polysilicon layer, and the source region and the drain region may be converted to be conductive by doping or the like, to realize the electrical connection between structures. That is, the active semiconductor layer of each transistor in each sub-pixel is an integral pattern formed by P-silicon, and each transistor in the same pixel circuit includes a doped region pattern (i.e., a source region and a drain region) and an active layer pattern, and the active layers of different transistors are separated by doped structures.

For example, the active semiconductor layer 310 can be made of amorphous silicon, polysilicon, oxide semiconductor materials and the like. It should be noted that, the above-mentioned source region and drain region may be regions doped with N-type impurities or P-type impurities.

For example, the active semiconductor layers in the pixel circuits of sub-pixels of different colors arranged along the first direction are disconnected from each other without a connection relationship. The active semiconductor layers in the pixel circuits of the sub-pixels arranged along the second direction may be integrally provided or disconnected from each other.

FIGS. 5-11 also illustrate the scanning signal lines Ga (including the first and second scanning signal lines Ga1 and Ga2), the reset control signal lines Rst (including the first and second reset control signal lines Rst1 and Rst2), the reset power signal lines Init of the reset voltage terminals Vinit (including the first reset power signal line Init1 of the first reset voltage terminal Vinit1 and the second reset power signal line Init2 of the second reset voltage terminal Vinit2), the light-emitting control signal lines EM (including the first and second light-emitting control signal lines EM1 and EM2), the data line Vd, and the first and second power signal lines 400 and 500, which are electrically connected to the pixel circuits 0121 of the sub-pixels of different colors. The first power signal line 400 and the second power signal line 500 are electrically connected to each other.

In the examples illustrated in FIGS. 5-11, the first scanning signal line Ga1 and the second scanning signal line Ga2 are the same signal line Ga, the first reset power signal line Init1 and the second reset power signal line Init2 are the same signal line Init, the first reset control signal line Rst1 and the second reset control signal line Rst2 are the same signal line Rst, and the first light-emitting control signal line EM1 and the second light-emitting control signal line EM2 are the same signal line EM, without limited thereto.

Figure 6:
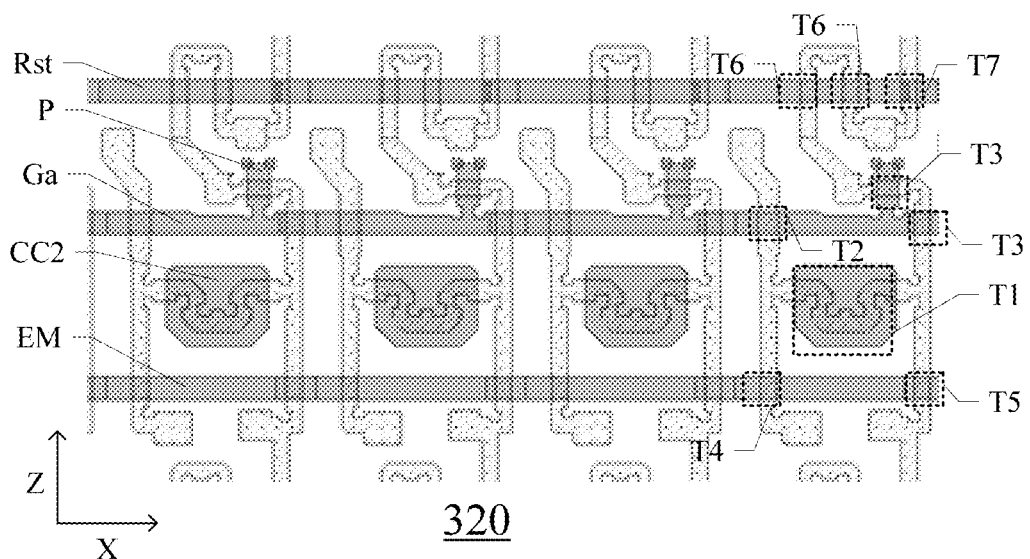

For example, a gate metal layer of the pixel circuit may include a first conductive layer and a second conductive layer. On the above-mentioned active semiconductor layer 310, a gate insulating layer (the gate insulating layer 160 illustrated in FIG. 2) is formed to insulate the active semiconductor layer 310 from the gate metal layer formed subsequently. FIG. 6 illustrates that the display substrate includes a first conductive layer 320, which is disposed on the gate insulating layer so as to be insulated from the active semiconductor layer 310. The first conductive layer 320 may include the second electrode CC2 of the capacitor C, the scanning signal line Ga, the reset control signal line Rst, the light-emitting control signal line EM, as well as the gates of the driving transistor T1, of the data writing transistor T2, of the threshold compensation transistor T3, of the first light-emitting control transistor T4, of the second light-emitting control transistor T5, of the first reset transistor T6 and of the second reset transistor T7.

For example, as illustrated in FIG. 6, the gate of the data writing transistor T2 may be a portion where the scanning signal line Ga overlaps with the active semiconductor layer 310; the gate of the first light-emitting control transistor T4 may be a first part where the light-emitting control signal line EM overlaps with the active semiconductor layer 310, and the gate of the second light-emitting control transistor T5 may be a second part where the light-emitting control signal line EM overlaps with the active semiconductor layer 310; the gate of the first reset transistor T6 is a first part where the reset control signal line Rst overlaps with the active semiconductor layer 310, and the gate of the second reset transistor T7 is a second part where the reset control signal line Rst overlaps with the active semiconductor layer 310; the threshold compensation transistor T3 may be a thin film transistor with a double gate structure, a first gate of which may be a portion where the scanning signal line Ga overlaps the active semiconductor layer 310, and a second gate of which may be a portion where a protruding structure P protruded from the scanning signal line Ga overlaps with the active semiconductor layer 310. As illustrated in FIGS. 4 and 6, the gate of the driving transistor T1 may be the second electrode CC2 of the capacitor C.

It should be noted that, the dotted rectangular boxes in FIGS. 5 and 6 illustrate the overlapping areas of the first conductive layer 320 and the active semiconductor layer 310. As the channel region of each transistor, the portions of the active semiconductor layer at both sides of each channel region are converted to be conductive by processes such as ion doping, so as to be used as the first electrode and the second electrode of each transistor.

For example, as illustrated in FIG. 6, the scanning signal line Ga, the reset control signal line Rst and the light-emitting control signal line EM are arranged along the second direction (Z direction). The scanning signal line Ga is located between the reset control signal line Rst and the light-emitting control signal line EM.

For example, in the second direction, the second electrode CC2 of the capacitor C (i.e., the gate of the driving transistor T1) is located between the scanning signal line Ga and the light-emitting control signal line EM. The protruding structure P protruded from the scanning signal line Ga is located at a side of the scanning signal line Ga away from the light-emitting control signal line EM.

For example, as illustrated in FIG. 6, in the second direction, the gate of the data writing transistor T2, the gate of the threshold compensation transistor T3 and the gate of first reset transistor T6 are all located at a first side of the gate of the driving transistor T1; and the gate of the first light-emitting control transistor T4, the gate of the second light-emitting control transistor T5 and the gate of the second reset transistor T7 are all located at a second side of the gate of the driving transistor T1. For example, in the example illustrated in FIG. 6, the first side and the second side of the gate of the driving transistor T1 of the pixel circuit of the sub-pixel are two opposite sides of the gate of the driving transistor T1 in the second direction. For example, as illustrated in FIG. 6, in the X-Z plane, the first side of the gate of the driving transistor T1 of the pixel circuit of the sub-pixel may be an upper side of the gate of the driving transistor T1, and the second side of the gate of the driving transistor T1 of the pixel circuit of the sub-pixel may be a lower side of the gate of the driving transistor T1. Regarding the lower side, for example, a side of the display substrate for bonding IC is the lower side of the display substrate, and a lower side of the gate of the driving transistor T1 is a side of the gate of the driving transistor T1 closer to the IC. The upper side is the opposite side of the lower side, for example, a side of the gate of the driving transistor T1 away from the IC is the upper side.

For example, in some embodiments, as illustrated in FIG. 6, in the first direction (X direction), the gate of the data writing transistor T2 and the gate of the first light-emitting control transistor T4 are located at a third side of the gate of the driving transistor T1; and the first gate of the threshold compensation transistor T3, the gate of the second light-emitting control transistor T5 and the gate of the second reset transistor T7 are all located at a fourth side of the gate of the driving transistor T1. For example, in the example illustrated in FIG. 6, the third side and fourth side of the gate of the driving transistor T1 of the pixel circuit of the sub-pixel are two opposite sides of the gate of the driving transistor T1 in the first direction X. For example, the third side of the gate of the driving transistor T1 of the pixel circuit may be the left side of the gate of the driving transistor T1 of the pixel circuit, and the fourth side of the gate of the driving transistor T1 of the pixel circuit may be the right side of the gate of the driving transistor T1 of the pixel circuit. Regarding the left side and the right side, for example, among the data line Vd and the second power signal line 500 connected with the same pixel circuit, the data line Vd is at the left side of the second power signal line 500 and the second power signal line 500 is at the right side of the data line Vd.

It should be noted that, the structure of each pixel circuit can be a mirror structure as illustrated in FIG. 6, that is, for each layer of each pixel circuit, taking the channel region of the driving transistor T1 as the reference, the structures at the left side and right side are reversed, so the above-mentioned relationship between the left side and the right side can be reversed.

Figure 7:
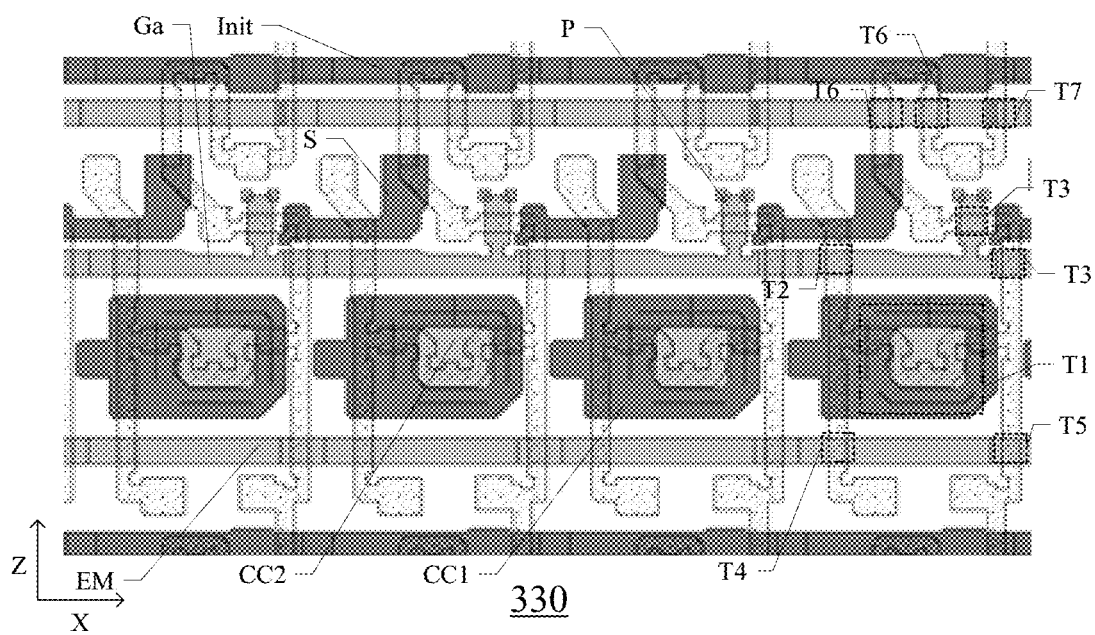

For example, a first insulating layer (such as the first insulating layer 150 illustrated in FIG. 2) is formed on the first conductive layer 320 to insulate the first conductive layer 320 from a second conductive layer 330 formed subsequently. FIG. 7 illustrates the second conductive layer 330 of the pixel circuit. The second conductive layer 330 includes the first electrode CC1 of the capacitor C, the reset power signal line Init, and a light shielding part S. The first electrode CC1 of the capacitor C and the second electrode CC2 of the capacitor C at least partially overlap to form the capacitor C.

For example, as illustrated in FIG. 7, the active semiconductor layer between two channels of the double-gate threshold compensation transistor T3 is in a floating state when the threshold compensation transistor T3 is turned off, and is easily affected by a voltage of surrounding wirings to jump, thus affecting a leakage current of the threshold compensation transistor T3 and further affecting the luminous brightness. In order to keep a stable voltage of the active semiconductor layer between the two channels of the threshold compensation transistor T3, the light shielding part S is designed to form a capacitor with the active semiconductor layer between the two channels of the threshold compensation transistor T3. The light shielding part S can be connected to the second power signal line to obtain a constant voltage, so the voltage of the active semiconductor layer in the floating state can be kept stable. The light shielding part S overlaps with the active semiconductor layer between the two channels of the double-gate threshold compensation transistor T3, which can also prevent the active semiconductor layer between the two gates from being irradiated to change its characteristics, for example, to prevent the voltage of this part of the active semiconductor layer from changing, so as to prevent from crosstalk.

Figure 8:
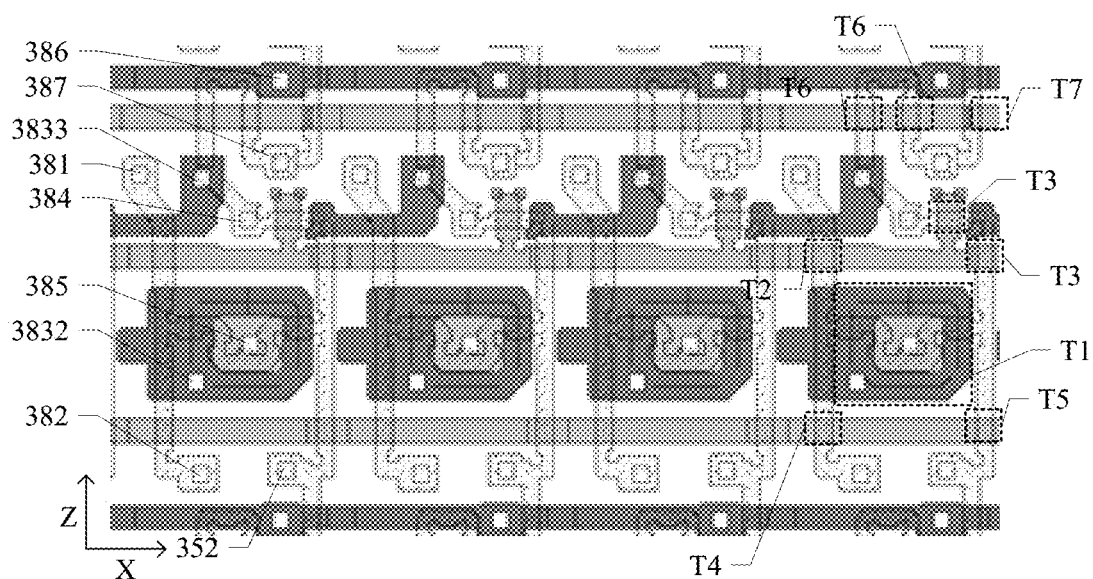
Figure 9:
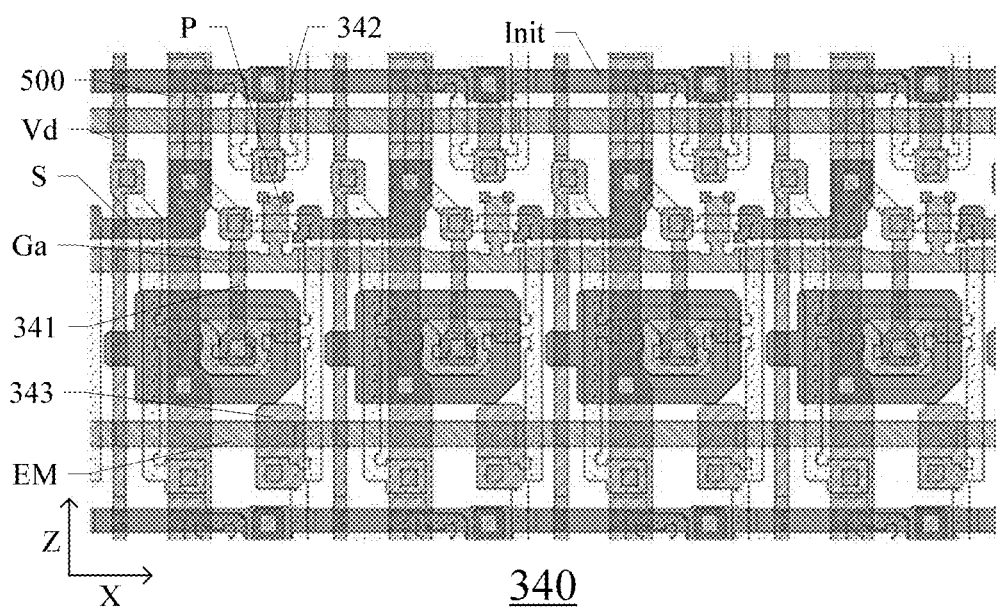

For example, a second insulating layer (such as the second insulating layer 140 illustrated in FIG. 2) is formed on the second conductive layer 330 to insulate the second conductive layer 330 from a source-drain metal layer 340 formed subsequently. FIG. 8 illustrates that a via hole in the second insulating layer formed on the second conductive layer 330, and FIG. 9 illustrates the source-drain metal layer 340 of the pixel circuit. As illustrated in FIGS. 8 and 9, the source-drain metal layer 340 includes the data line Vd and the second power signal line 500. The above-mentioned data line Vd and the second power signal line 500 both extend in the Z direction.

For example, the source-drain metal layer 340 further includes a first connecting part 341, a second connecting part 342 and a third connecting part 343. FIGS. 8 and 9 illustrate exemplary positions of a plurality of via holes, and the source-drain metal layer 340 is connected to the active semiconductor layer 310, the first conductive layer 320 and the second conductive layer 330 through the plurality of via holes as illustrated.

For example, as illustrated in FIGS. 8 and 9, the data line Vd is electrically connected to the second electrode of the data writing transistor T2 through a via hole 381 penetrating through the gate insulating layer, the first insulating layer and the second insulating layer. The second power signal line 500 is electrically connected to the first electrode of the first light-emitting control transistor T4 through a via hole 382 penetrating through the gate insulating layer 160, the first insulating layer 150 and the second insulating layer 140. The second power signal lines 500 and data lines Vd are alternately arranged along the first direction. The second power signal line 500 is electrically connected with the first electrode CC1 of the capacitor C through a via hole 3832 penetrating through the second insulating layer 140. The second power signal line 500 is electrically connected with the light shielding part S through a via hole 3833 penetrating through the second insulating layer to provide a constant voltage for the light shielding part S. One end of the first connecting part 341 is electrically connected with the second electrode of the threshold compensation transistor T3 through a via hole 384 penetrating through the gate insulating layer 160, the first insulating layer 150 and the second insulating layer 140, and the other end of the first connecting part 341 is electrically connected with the gate of the driving transistor T1 (i.e., the second electrode CC2 of the capacitor C) through a via hole 385 penetrating through the first insulating layer 150 and the second insulating layer 140. One end of the second connecting part 342 is electrically connected with the reset power signal line Init through a via hole 386 penetrating through the second insulating layer 140, and the other end of the second connecting part 342 is electrically connected with the first electrode of the second reset transistor T7 through a via hole 387 penetrating through the gate insulating layer 160, the first insulating layer 150 and the second insulating layer 140. The third connecting part 343 is electrically connected with the second electrode of the second light-emitting control transistor T5 through a via hole 352 penetrating through the gate insulating layer 160, the first insulating layer 150 and the second insulating layer 140.

Figure 10:
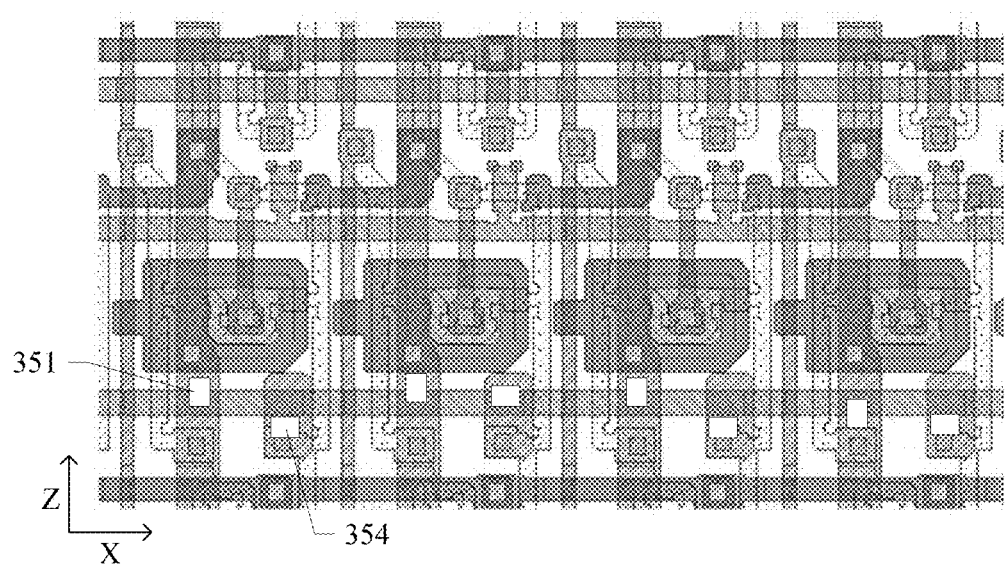

For example, a passivation layer 123 and a second planarization layer 122 (as illustrated in FIGS. 2-3B) are formed on the source-drain metal layer 340 to protect the above-mentioned source-drain metal layer 340. As illustrated in FIG. 10, the passivation layer 123 and the second planarization layer 122 include a via 351 and a via 354.

Figure 3C:
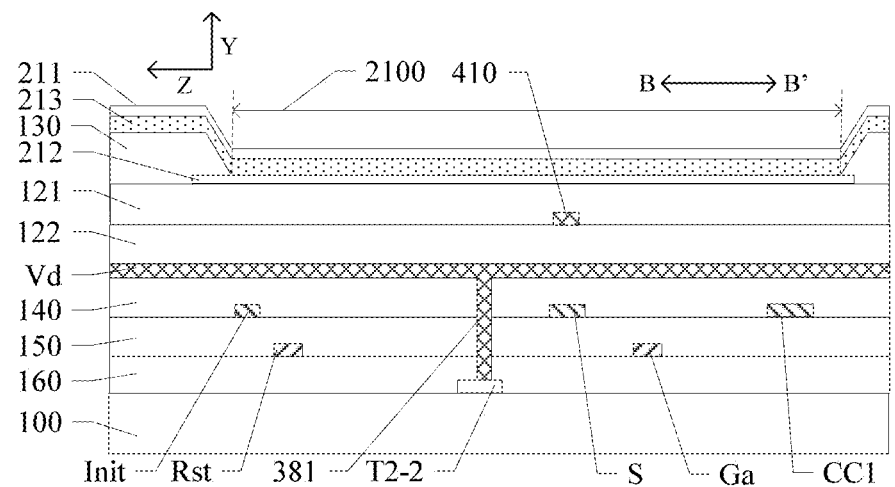
FIG. 3C is a cross-sectional view taken along the BB' line illustrated in FIG. 1B according to another example of the embodiment of the present disclosure.

Embodiments of the present disclosure are not limited to forming the passivation layer 123 and the second planarization layer 122 on the source-drain metal layer 340 as described above. FIG. 3C is a sectional view taken along the BB' line illustrated in FIG. 1B according to another example of the embodiment of the present disclosure. For example, as illustrated in FIG. 3C, it's also possible that only the second planarization layer 122 is formed on the source-drain metal layer 340, and the passivation layer 123 is not formed.

Figure 11:
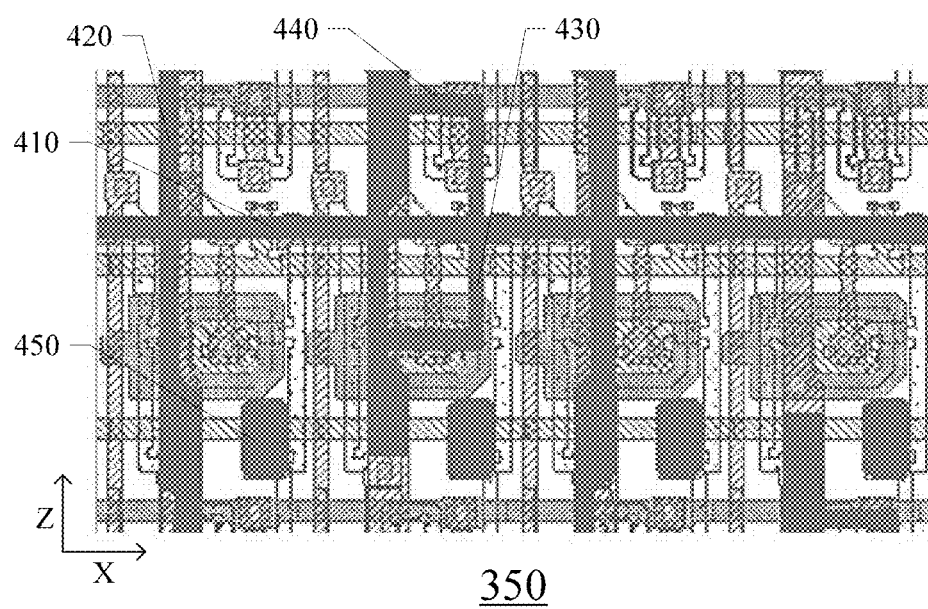

For example, FIG. 11 illustrates a third conductive layer 350 of the pixel circuit. The third conductive layer 350 includes a fourth connecting part 450 and first power signal lines 400 distributed crosswise along the X direction and the Y direction. FIG. 11 also illustrates exemplary positions of a plurality of via holes 351 and 354, and the third conductive layer 350 is connected with the source-drain metal layer 340 through the plurality of via holes 351 and 354 as illustrated. A first planarization layer 121 is disposed at a side of the third conductive layer 350 away from the base substrate 100; the second electrode of the organic light-emitting element of each sub-pixel may be disposed at a side of the first planarization layer 121 away from the base substrate 100; and the second electrode of the organic light-emitting diode is electrically connected with the fourth connecting part 450 through a via hole 1210 disposed in the first planarization layer 121 to realize an electrical connection with the second electrode of the second light-emitting control transistor T5.

For example, as illustrated in FIGS. 1A-1B and FIG. 11, the third conductive layer 350 includes a plurality of fourth connecting parts 450, and one column of fourth connecting parts 450 are arranged between two adjacent second power signal sub-lines 420. For example, the pixel circuit of each sub-pixel includes one fourth connecting part 450, and the plurality of fourth connecting parts 450 included in the plurality of sub-pixels are arranged in an array along the first direction and the second direction. For example, the plurality of fourth connecting parts 450 are arranged along the first direction at equal intervals, and the plurality of fourth connecting parts 450 are also arranged along the second direction at equal intervals.

For example, along the direction perpendicular to the base substrate 100, each effective light-emitting region has no overlap with the fourth connecting part 450. For example, a center line of an orthographic projection of the third effective light-emitting region 2300 on the base substrate 100 passes through an orthographic projection of one column of fourth connecting parts 450 on the base substrate 100. For example, a straight line extending in the second direction where the pad 430 is located passes through one column of fourth connecting parts 450. For example, a distance between edges (close to each other) of two adjacent fourth connecting parts 450 arranged along the first direction is larger than a size of the second effective light-emitting region 2200 along the first direction. For example, a distance between edges (close to each other) of two adjacent fourth connecting parts 450 arranged along the second direction is larger than a size of each effective light-emitting region along the second direction. For example, the distance between the edges (close to each other) of two adjacent fourth connecting parts 450 arranged along the second direction is smaller than a size of the fracture 421 along the second direction.

For example, a first planarization layer 121 (illustrated in FIG. 2) is disposed between the second electrode and the third conductive layer 350 included in the sub-pixels of different colors, and the second electrode is connected with the fourth connecting part 450 through a via hole disposed in the first planarization layer to realize a connection with the second electrode of the second light-emitting control transistor T5.

Figure 12:
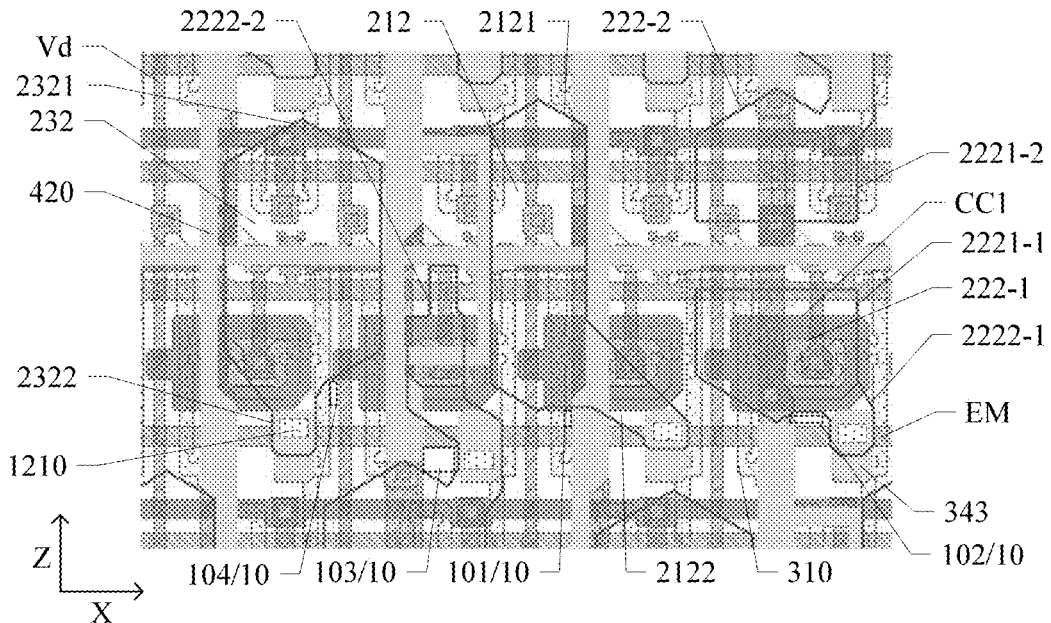
FIG. 12 is a schematic plan view of organic light-emitting elements arranged in one-to-one correspondence with the pixel circuit structures illustrated in FIG. 11.
Figure 13:
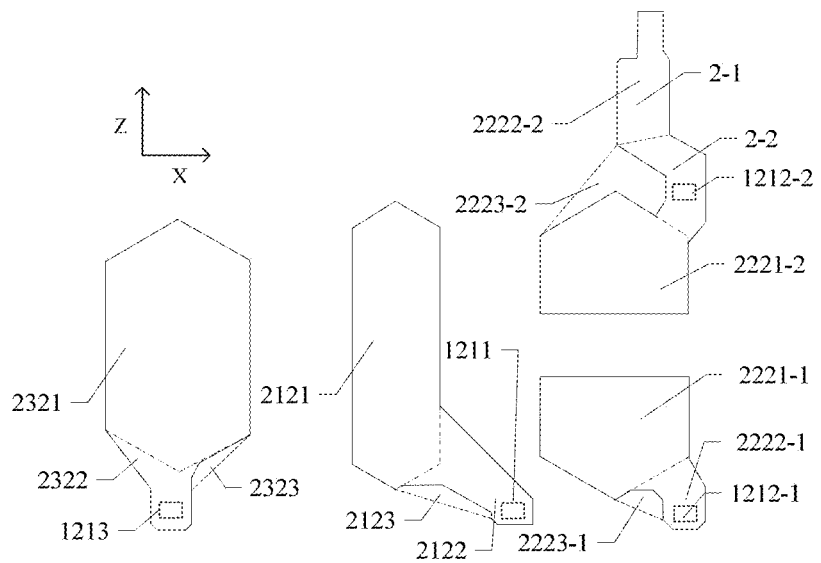
FIG. 13 is a schematic diagram illustrating a planar shape of a second electrode of each sub-pixel.

FIG. 12 is a schematic plan view of organic light-emitting elements arranged in one-to-one correspondence with the pixel circuit structures illustrated in FIG. 11, and FIG. 13 is a schematic diagram illustrating a planar shape of a second electrode of each sub-pixel.

For example, as illustrated in FIGS. 1B and 12, along the direction perpendicular to the base substrate 100, the first effective light-emitting region 2100 overlaps with the data line Vd which is connected to the second electrode of the data writing transistor T2 of the first color sub-pixel 210.

For example, as illustrated in FIG. 1B and FIG. 12, along the direction perpendicular to the base substrate 100, the second effective light-emitting region 2201 overlaps with the second power signal line 500 connected to the first electrode of the first light-emitting control transistor T4 of the second color sub-pixel 220, overlaps with the second connecting part 342 of the second color sub-pixel 220, and overlaps with the data line Vd connected to the second electrode of the data writing transistor T2 of the second color sub-pixel 220; the second center line overlaps with the second power signal line 500; the second connecting part 342 and the data line Vd are located at both sides of the second center line. Along the direction perpendicular to the base substrate 100, the second effective light-emitting region 2202 overlaps with the data line Vd, overlaps with the second power signal line 500, and overlaps with the first connecting part 341; the second center line overlaps with the second power signal line 500; the first connecting part 341 and the data line Vd are located at both sides of the second center line.

For example, as illustrated in FIG. 1B and FIG. 12, along the direction perpendicular to the base substrate 100, the third effective light-emitting region 2300 overlaps with the data line Vd connected to the second electrode of the data writing transistor T2 of the adjacent second color sub-pixel 220, and overlaps with the first connecting part 341 and the second connecting part 342 of the third color sub-pixel 230; the data line Vd is located at one side of the third center line; the first connecting part 341 and the second connecting part 342 are located at the other side of the third center line.

For example, as illustrated in FIG. 12, along the direction perpendicular to the base substrate 100, a portion of the second connecting part 342 electrically connected with the first electrode of the second reset transistor T7 through the via hole 387 overlaps with the fracture. For example, along the direction perpendicular to the base substrate 100, a portion of the light shielding part S extending in the Z direction overlaps with the fracture; and the via hole 3833 overlaps with the fracture. For example, along the direction perpendicular to the base substrate 100, a portion of the first electrode CC1 of the capacitor C connected with the second power signal line through the via hole 3832 overlaps with the fracture.

For example, as illustrated in FIGS. 5-13, the second electrode 212 of the first color sub-pixel 210 includes a first main electrode 2121 and a first connecting electrode 2122. The first main electrode 2121 and the first connecting electrode 2122 may have an integrated structure, and the first connecting electrode 2122 is connected to the fourth connecting part 450 through the via hole 1210 to realize a connection with the second electrode of the second light-emitting control transistor T5 of the first color sub-pixel 210.

For example, the second electrode 222 of each second color sub-pixel in the second color sub-pixel pair 220 includes a second main electrode 2221 and a second connecting electrode 2222. The second electrode of the first sub-pixel in the second color sub-pixel pair 220 includes a second main part 2221-1 and a second connecting part 2222-1, and the second electrode of the second sub-pixel in the second color sub-pixel pair 220 includes a second main part 2221-2 and a second connecting part 2222-2. For example, the second main electrode 2221 and the second connecting electrode 2222 of each second color sub-pixel may have an integrated structure, and the second connecting electrode 2222 of the second color sub-pixel is connected to the fourth connecting part 450 through the via hole 1210 to realize a connection with the second electrode of the second light-emitting control transistor T5 of the second color sub-pixel.

For example, the second electrode 232 of the third color sub-pixel 230 includes a third main electrode 2321 and a third connecting electrode 2322. For example, the third main electrode 2321 and the third connecting electrode 2322 may have an integrated structure, and the third connecting electrode 2322 is connected to the fourth connecting part 450 through the via hole 1210 to realize a connection with the second electrode of the second light-emitting control transistor T5 of the third color sub-pixel 130.

For example, the first connecting electrode 2122 of the first color sub-pixel 210 is located at a side of the first main electrode 2121 close to the second color sub-pixel pair 220, the second connecting electrode 2222 of the second color sub-pixel pair 220 is located at a side of the second main electrode 2221 away from the first color sub-pixel 210, and the third center line of the third effective light-emitting region 2300 of the third color sub-pixel 230 passes through the third main electrode 2321 and the third connecting electrode 2322.

For example, as illustrated in FIG. 1A, FIG. 1B, FIG. 12, and FIG. 13, the shape of the main electrode of each sub-pixel is substantially the same as that of the light-emitting region, and the area of the main electrode of each sub-pixel is larger than that of the effective light-emitting region. For example, the geometric center of the main electrode of each sub-pixel roughly coincides with the geometric center of the effective light-emitting region. For example, the first main electrode 2121 of the first color sub-pixel 210 and the third main electrode 2321 of the third color sub-pixel 230 are generally hexagonal or elliptical in shape, and the second main electrode 2221 of each second color sub-pixel in the second color sub-pixel pair 220 is generally pentagonal, circular or water drop in shape.

Figure 14:
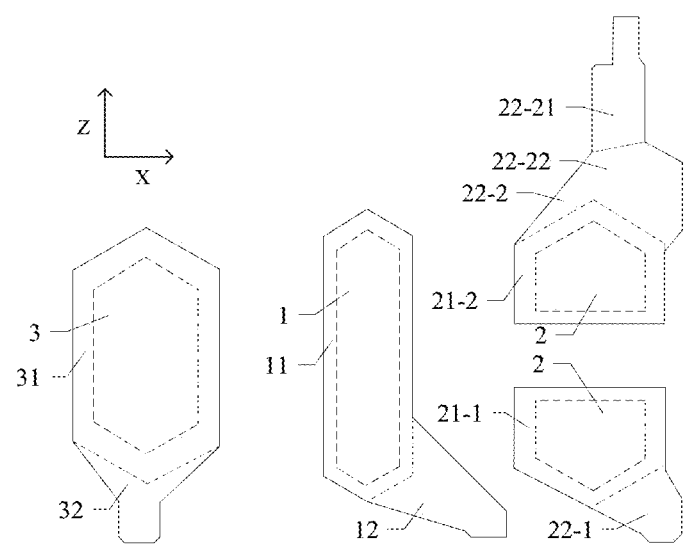
FIG. 14 is a schematic diagram illustrating a planar structure of a second electrode of each sub-pixel in a display substrate.

For example, FIG. 14 is a schematic diagram illustrating a planar structure of a second electrode of each sub-pixel in a display substrate. The display substrate illustrated in FIG. 14 is different from the display substrate in the embodiment illustrated in FIGS. 1-13 of the present disclosure in that, the shape of the connecting electrode of the second electrode of the organic light-emitting element illustrated in FIG. 14 is different from the shape of the connecting electrode of the second electrode of the organic light-emitting element in the embodiment illustrated in FIG. 13 of the present disclosure. As illustrated in FIG. 14, the shape of the main electrode 11 included in the second electrode of the organic light-emitting element of the first color sub-pixel and the shape of the light-emitting region 2 thereof are both hexagon; the shape of the main electrode 31 included in the second electrode of the organic light-emitting element of the third color sub-pixel and the shape of the light-emitting region 3 thereof are both hexagon; the shape of the main electrode 21 included in the second electrode of the organic light-emitting element of the second color sub-pixel and the shape of the light-emitting region 2 thereof are both pentagon. The second electrode of one second color sub-pixel includes a main electrode 21-1 and a connecting electrode 22-1, and the second electrode of the other second color sub-pixel includes a main electrode 21-2 and a connecting electrode 22-2. The main electrode and the connecting electrode in the second electrode of each sub-pixel may have an integrated structure, then a boundary between the main electrode and the connecting electrode is the boundary illustrated by the dotted line in FIG. 14. It can be seen from FIG. 14 that, the shape of the main electrode of each sub-pixel can be a regular polygon, and the shape of the connecting electrode can be an irregular shape.

When the display substrate illustrated in FIG. 14 is applied to perform fingerprint detection, in-screen fingerprint detection technology may be adopted. The in-screen fingerprint detection technology relies on a light reflection to detect a fingerprint loop, and compares an obtained fingerprint image with an image in database to achieve the purpose of fingerprint detection. The in-screen fingerprint detection technology particularly is widely used in organic light-emitting diode display devices.

The in-screen fingerprint detection technology usually uses light emitted from the display substrate as the light source, and a fingerprint sensor is usually disposed on the non-display side of the display substrate, for example, it can be located at the side of the organic light-emitting element close to the base substrate so as to realize the in-screen fingerprint detection function.

For example, the light emitted by the sub-pixels can be used for display and in-screen fingerprint detection, and the side of the sub-pixel away from the base substrate can also be provided with a top film layer to place a finger; a fingerprint sensor for collecting fingerprint images can be disposed on the same side of the display substrate as the sub-pixels, and the fingerprint sensor is disposed on the side of the organic light-emitting element of each sub-pixel close to the base substrate for detecting the reflected light reflected by the fingerprint on the surface of the top film layer. The fingerprint sensor may include a plurality of detection units arranged in an array. In order to realize the in-screen fingerprint detection function, at least part of the film layers such as the top film layer and the base substrate is transparent, and a transparent region (which is the transparent region of the display substrate) is arranged between adjacent sub-pixels, so that the reflected light reflected by the fingerprint on the surface of the top film layer can be incident on the fingerprint sensor to acquire the fingerprint image. Since the anode (the second electrode) of the organic light-emitting element of each sub-pixel is made of opaque material, a light shielding area of the anode of each sub-pixel will affect the light transmittance, thus affecting the sensitivity of fingerprint detection.

As illustrated in FIG. 14, in the first color sub-pixel, an area ratio of the effective light-emitting region 1 to the second electrode is approximately 52.85%; in the second color sub-pixel, an area ratio of the effective light-emitting region 2 to the second electrode is approximately 42.31%; in the third color sub-pixel, an area ratio of the effective light-emitting region 3 to the second electrode is approximately 66.99%. An area ratio of the second electrode in the first color sub-pixel to the two second electrodes in the second color sub-pixel pair to the second electrode in the third color sub-pixel is 1:1.58:1.16.

Under the condition that an area of the light-emitting region of each sub-pixel remains unchanged, a light shading area can be reduced by changing the shape of a region of the second electrode located outside the effective light-emitting region, such as the connecting electrode, and an area of the transparent region of the display substrate can be increased, thereby improving the sensitivity of fingerprint detection.

Under the condition that an area of the effective light-emitting region of each sub-pixel remains unchanged, compared with the shape of the second electrode of each sub-pixel in the display substrate illustrated in FIG. 14, the display substrate provided by the embodiment of the present disclosure can reduce the light shielding area of the second electrode and improve the light transmittance of the display substrate by reducing the area of the region of the sub-pixel located outside the effective light-emitting region, such as the connecting electrode.

For example, as illustrated in FIGS. 1A and 12-13, in the first color sub-pixel 210, an area ratio of the first effective light-emitting region 2100 to the second electrode 212 is 53%-55%; in the second color sub-pixel pair 220, an area ratio of the two second effective light-emitting regions 2200 to the two second electrodes 222 is 43.5%-48%; in the third color sub-pixel 220, an area ratio of the third effective light-emitting region 2300 to the second electrode 212 is 67.5%-69%. The first color sub-pixel, the second color sub-pixel and the third color sub-pixel in the embodiment of the present disclosure may be in one-to-one correspondence with the first color sub-pixel, the second color sub-pixel and the third color sub-pixel in FIG. 14. For example, in the first color sub-pixel 210, an area ratio of the first effective light-emitting region 2100 to the second electrode 212 is 54.9%; in the second color sub-pixel pair 220, an area ratio of the two second effective light-emitting regions 2200 to the two second electrodes 222 is 47%; and in the third color sub-pixel 230, an area ratio of the third effective light-emitting region 2300 to the second electrode 232 is 68.3%; in this way, the overall transmittance of the display substrate is improved by about 0.23%. Compared with the display substrate illustrated in FIG. 14, the embodiment of the present disclosure can improve the overall transmittance of the display substrate by increasing the area ratio of the effective light-emitting region to the second electrode in each sub-pixel, thereby improving the sensitivity of fingerprint detection.

For example, an area ratio of the first effective light-emitting region 2100 to the two second effective light-emitting regions 2200 in the second color sub-pixel pair 220 to the third effective light-emitting region 2300 is approximately 1:1.27:1.47; an area ratio of the second electrode 212 of the first color sub-pixel 210 to the two second electrodes 222 of the second color sub-pixel pair 220 to the second electrode 232 of the third color sub-pixel 230 is approximately 1:1.48:1.18.

For example, as illustrated in FIGS. 1A-13, in each sub-pixel, at least one notch is provided at a portion where the connecting electrode is connected with the main electrode; and along the direction perpendicular to the base substrate 100, the region of the display substrate corresponding to at least a part of the notch is a transparent region. The transparent region 10 here includes a region where the pixel circuit 0221, the first power signal line 400, the second power signal line 500, the data line Vd, the scanning signal line Ga, the reset power signal line Init, the reset control signal line Rst, and the light-emitting control signal line EM are not provided. That is, the transparent region 10 refers to a region where light can be incident onto the fingerprint sensor from a transparent part on the base substrate 100 that is not covered by a light shielding film layer, which includes the active semiconductor layer 310, the first conductive layer 320, the second conductive layer 330, the source-drain metal layer 340, the third conductive layer 350, and the film layer where the second electrode of each sub-pixel is located. For example, for the region corresponding to at least a part of the notch, no projection of the active semiconductor layer 310, the first conductive layer 320, the second conductive layer 330, the source-drain metal layer 340 or the third conductive layer 350 falls within this region. For example, for the region corresponding to at least a part of the notch, no projection of the via hole, the connecting part or the pad falls within this region. For example, one or more insulating layers, such as one or more of the gate insulating layer 160, the first insulating layer 150, the second insulating layer 140, the passivation layer 123, first planarization layer 121, the second planarization layer 122 and the like are provided in the region corresponding to at least a part of the notch, and the transmittance of the one or more insulating layers is higher than that of any one of the active semiconductor layer 310, the first conductive layer 320, the second conductive layer 330, the source-drain metal layer 340 and the third conductive layer 350. For example, one or more insulating layers, such as one or more of the gate insulating layer 160, the first insulating layer 150, the second insulating layer 140, the passivation layer 123, the first planarization layer 121, the second planarization layer 122 and the like are provided in the region corresponding to at least a part of the notch, and are sequentially formed on the display substrate. Furthermore, in the transparent region, the multiple insulating layers are immediately adjacent to each other, that is, in the direction away from the display substrate, the second insulating layer is in direct contact with the first insulating layer, and the third insulating layer is in direct contact with the second insulating layer. For example, the one or more insulating layers may be organic layers or inorganic layers. For example, the region corresponding to at least a part of the notch is configured as a transparent region, in which the gate insulating layer is formed on the surface of the base substrate, the first insulating layer is located on the surface of the gate insulating layer away from the base substrate, the second insulating layer is located on the surface of the first insulating layer away from the base substrate, the passivation layer is located on the surface of the second insulating layer away from the base substrate, the second planarization layer is located on the surface of the passivation layer away from the base substrate, the first planarization layer is located on the surface of the second planarization layer away from the base substrate, and the second electrode such as the anode is a notch at this position, that is, the surface of the first planarization layer away from the base substrate is in direct contact with the pixel defining layer formed after the second electrode. For example, the region corresponding to at least a part of the notch is configured as a transparent region, in which the gate insulating layer is formed on the surface of the base substrate, the first insulating layer is located on the surface of the gate insulating layer away from the base substrate, the second insulating layer is located on the surface of the first insulating layer away from the base substrate, the second planarization layer is located on the surface of the second insulating layer away from the base substrate, the first planarization layer is located on the surface of the second planarization layer away from the base substrate, and the second electrode such as the anode is a notch at this position, that is, the surface of the first planarization layer away from the base substrate is in direct contact with the pixel defining layer formed after the second electrode. For example, as illustrated in FIG. 12-FIG. 13, in the first color sub-pixel 210, a first notch 2123 is provided at a connecting portion between the first connecting electrode 2122 and the first main electrode 2121, and a region of the display substrate corresponding to at least a part of the first notch 2123 is a transparent region 10. That is, part of the first notch 2123 has no overlap with the active semiconductor layer 310, the first conductive layer 320, the second conductive layer 330, the source-drain metal layer 340 or the third conductive layer 350; and a region of the first notch 2123 that has no overlap with the above film layers forms a transparent region of the display substrate. As illustrated in FIG. 13-FIG. 14, the first notch 2123 is a concave part of the first connecting electrode 2122 in the embodiment of the present disclosure which is inwardly concaved relative to the connecting electrode 12 illustrated in FIG. 14. A portion of the concave part overlaps with light shielding film layer(s) such as the active semiconductor layer 310, the first conductive layer 320 and the source-drain metal layer 340, while the other portion of the concave part only overlaps with the base substrate 100 and a plurality of transparent insulating layers. That is, the position of the first notch should be selected in consideration of its positional relationship with a light-transmitting area exposed by the light shielding film layer(s) except the film layer where the second electrode is located, and at least a part of the first notch and the above-mentioned light-transmitting area together constitute the transparent region of the display substrate.

For example, the side of the connecting electrode 12 connected to the main electrode 11 illustrated in FIG. 14 is substantially a straight side, and the first notch 2123 illustrated in FIG. 13 is a notch formed by bending the above-mentioned straight side towards the side close to the first main electrode 2121. Compared with the display substrate illustrated in FIG. 14, in the embodiment of the present disclosure, the light transmittance of the display substrate can be improved by providing a notch at the position on the first connecting electrode directly opposite to the transparent region, thereby improving the sensitivity of fingerprint detection.

For example, as illustrated in FIG. 12-FIG. 13, along the direction perpendicular to the base substrate 100, a region 101 surrounded by the light-emitting control signal line EM connected with the pixel circuit of the first color sub-pixel 210, the second power signal line 500, the active semiconductor layer 310 including the channel region and the source-drain doped region of each transistor of each sub-pixel, and the first electrode CC1 of the storage capacitor C has an overlap with the first notch 2123 of the second electrode 212 of the first color sub-pixel 210. Compared with the connecting electrode 12 illustrated in FIG. 14, in the embodiment of the present disclosure, the light transmittance of the display substrate can be improved by providing the first notch 2123 at a position on the first connecting electrode 2122 corresponding to the region 101.

For example, as illustrated in FIG. 12-FIG. 13, in the first color sub-pixel 210, the first connecting electrode 2122 is connected to the fourth connecting part 450 through a first connecting via hole 1211, and the first notch 2123 is located on the side of the first connecting via hole 1211 away from the second color sub-pixel 220 located in the same repeating unit as the first color sub-pixel 210. The concaved degree of the first notch 2123 depends on a distance between an edge of the first connecting electrode 2122 and the first connecting via hole 1211, and the first notch 2123 needs to avoid the first connecting via hole 1211 to prevent from affecting the electrical connection between the first connecting electrode 2122 and the fourth connecting part 450. For example, the first notch 2123 is a notch formed by inwardly bending one side edge of the first connecting electrode 2122 directly opposite to the first connecting via hole 1211 and away from the second color sub-pixel 220, and the edge of the notch extends to the edge of the first main electrode 2121.

For example, as illustrated in FIG. 14, a part of the connecting electrode 12 close to the side of the main electrode 11 is relatively wide in the X direction, that is, a width from a portion of the connecting via hole connected with the connecting electrode 12 to the main electrode 11 is relatively large in the X direction. Therefore, after the first notch 2123 illustrated in FIG. 13 is formed on the connecting electrode 12 illustrated in FIG. 14, it can be ensured that the first connecting electrode 2122 can still be reliably connected with the fourth connecting part 450 through the first connecting via hole 1211.

For example, as illustrated in FIGS. 12-13, in the second electrode 222-1 of the first sub-pixel of the second color sub-pixel pair 220, a second notch 2223-1 is provided at a part where the first connecting electrode 2222-1 and the first main electrode 2221-1 are connected, and a region of the display substrate corresponding to at least a part of the second notch 2223-1 is a transparent region. That is, a part of the second notch 2223-1 has no overlap with the active semiconductor layer 310, the first conductive layer 320, the second conductive layer 330, the source-drain metal layer 340 or the third conductive layer 350, and a region of the second notch 2223-1 that has no overlap with the above film layers forms a transparent region of the display substrate. As illustrated in FIGS. 13-14, the second notch 2223-1 is a concave part of the second connecting electrode 2222-1 in the embodiment of the disclosure concaved relative to the connecting electrode 22-1 illustrated in FIG. 14, a portion of the above-mentioned concave part overlaps with the light shielding film layer(s) such as the active semiconductor layer 310, the first conductive layer 320 and the source-drain metal layer 340, and the other portion of the above-mentioned concaved part only overlaps with the base substrate 100 and the multiple transparent insulating layers; that is, the position of the second notch should be selected in consideration of its positional relationship with a light-transmitting area exposed by the light shielding film layer(s) except the film layer where the second electrode is located, and at least a part of the second notch and the above-mentioned light-transmitting area together constitute the transparent region of the display substrate.

For example, the side of the connecting electrode 22-1 illustrated in FIG. 14 that is connected with the main electrode 21-1 is approximately a straight side, and the second notch 2223-1 illustrated in FIG. 13 is a notch formed by bending the above-mentioned straight side towards the side close to the second main electrode 2221-1. Compared with the display substrate illustrated in FIG. 14, the embodiment of the present disclosure can improve the light transmittance of the display substrate, and further improve the sensitivity of fingerprint detection by providing a notch at a position on the second connecting electrode directly opposite to the transparent region.

For example, as illustrated in FIG. 12-FIG. 13, along the direction perpendicular to the base substrate 100, in the area surrounded by the light-emitting control signal line EM connected to the pixel circuit of the first sub-pixel in the second color sub-pixel pair 220, the second power signal line 500 and the first electrode CC1 of the storage capacitor C, a region 102 close to the light-emitting control signal line EM has an overlap with the second notch 2223-1 of the second electrode 222-1 in the first sub-pixel. Compared with the connecting electrode 22-1 illustrated in FIG. 14, in the embodiment of the present disclosure, the light transmittance of the display substrate can be improved by providing the second notch 2223-1 at a position on the second connecting electrode 2222-1 corresponding to the region 102.

For example, as illustrated in FIGS. 12-13, in the second electrode 222-2 of the second sub-pixel of the second color sub-pixel pair 220, a third notch 2223-2 is provided at a part where the second connecting electrode 2222-2 and the second main electrode 2221-2 are connected, and at least a part of the display substrate corresponding to the third notch 2223-2 is a transparent region. That is, a part of the third notch 2223-2 has no overlap with the active semiconductor layer 310, the first conductive layer 320, the second conductive layer 330, the source-drain metal layer 340 or the third conductive layer 350; and a region of the third notch 2223-2 that has no overlap with the above film layers forms a transparent region of the display substrate. As illustrated in FIGS. 13-14, the third notch 2223-2 is a concave part of the second connecting electrode 2222-2 in the embodiment of the present disclosure concaved relative to the connecting electrode 22-2 illustrated in FIG. 14, a portion of the above-mentioned concave part overlaps with the light shielding film layer(s) such as the active semiconductor layer 310, the first conductive layer 320 and the source-drain metal layer 340, and the other portion of the above-mentioned concave part only overlaps with the base substrate 100 and the multiple transparent insulating layers; that is, the position of the third notch should be selected in consideration of its positional relationship with a light-transmitting area exposed by the light shielding film layer(s) except the film layer where the second electrode is located, and at least a part of the third notch and the above-mentioned light-transmitting area together constitute the transparent region of the display substrate.

For example, the side of the connecting electrode 22-2 illustrated in FIG. 14 connected to the main electrode 21-2 is approximately a straight side, and the second notch 2223-2 illustrated in FIG. 13 is a notch formed by bending the above-mentioned straight side towards the side away from the first color sub-pixel. Compared with the display substrate illustrated in FIG. 14, the embodiment of the present disclosure can improve the light transmittance of the display substrate and further improve the sensitivity of fingerprint detection by providing a notch at a position on the second connecting electrode directly opposite to the transparent region.

For example, as illustrated in FIGS. 12-13, in the second sub-pixel of the second color sub-pixel pair 220, the second connecting electrode 2222-2 includes a first part 2-1 extending along the second direction and a curved second part 2-2, the first part 2-1 is located at a side of the second part 2-2 away from the second main electrode 2221-2, the second part 2-2 is connected with the main electrode 2221-2, and a maximum size of the first part 2-1 along the first direction is larger than a maximum size of the second part 2-2 along the first direction.

For example, as illustrated in FIG. 12-FIG. 13, along the direction perpendicular to the base substrate 100, in the area surrounded by the light-emitting control signal line EM connected to the pixel circuit of the second sub-pixel, the second power signal line 500 and the third connecting part 343, a region 103 close to the second power signal line 500 and the light-emitting control signal line EM has an overlap with the third notch 2223-2 of the second electrode 222-2 of the second sub-pixel.

Compared with the connecting electrode 22-2 illustrated in FIG. 14, in the embodiment of the present disclosure, the light transmittance of the display substrate can be increased by providing the third notch 2223-2 at a position on the second connecting electrode 2222-2 corresponding to the region 103.

The first part 22-21 included in the connecting electrode 22-2 illustrated in FIG. 14 has basically the same shape and size as the first part 2-1 included in the second connecting electrode 2222-2 described in the embodiment of the present disclosure, while the second part 22-22 included in the connecting electrode 22-2 illustrated in FIG. 14 has a size along the first direction which is larger than that of the first part 22-21 along the first direction, and the second part 22-22 covers a portion of the light-transmitting area exposed by the light-shielding film layer(s) except the film layer where the second electrode is located, so that the light transmittance of the display substrate can be improved by reducing the overlapping area of the second part 22-22 with the above-mentioned light-transmitting area, for example, by removing the portion which is close to the first effective light-emitting region of the first color sub-pixel and covers the above-mentioned light-transmitting area to form the third notch 2223-2.

For example, the second part 22-22 of the connecting electrode 22-2 illustrated in FIG. 14 is connected with both a first side of the main electrode 21-2 close to the first color sub-pixel and a second side of the main electrode 21-2 away from the first color sub-pixel, while the second part 2-2 of the second connecting electrode 2222-2 in the embodiment of the present disclosure is only connected with the second side of the second main electrode 2221-2 away from the first color sub-pixel, so that the light-transmitting area close to the first side of the second main electrode 2221-2 is not covered by the second connecting electrode.

For example, as illustrated in FIG. 12-FIG. 13, in the second sub-pixel, the second connecting electrode 2222-2 has no overlap with the source-drain doped region of the first light-emitting control transistor T4. A portion of the second part 22-22 of the connecting electrode 22-2 illustrated in FIG. 14 close to the first effective light-emitting region 1 of the first color sub-pixel covers the source-drain doped region of the first light-emitting control transistor T4. According to the embodiment of the present disclosure, by removing a portion of the second part 22-22 of the connecting electrode 22-2 illustrated in FIG. 14 close to the first color sub-pixel, the second part 2-2 of the second connecting electrode 2222-2 has no overlap with the source-drain doped region of the first light-emitting control transistor T4, so that the second part 2-2 has no overlap with the light-transmitting area close to the source-drain doped region of the first light-emitting control transistor T4, and the light transmittance of the display substrate is improved.

For example, as illustrated in FIG. 12-FIG. 13, in the second color sub-pixel 220, the first connecting electrode 2222-1 is connected to the fourth connecting part 450 through the second connecting via hole 1212-1, and the second notch 2223-1 is located on a side of the second connecting via hole 1212-1 close to the first color sub-pixel 210 which is located in the same repeating unit as the second color sub-pixel 220. The concaved degree of the second notch 2223-1 depends on a distance between an edge of the first connecting electrode 2222-1 and the second connecting via hole 1212-1, and the second notch 2223-1 needs to avoid the second connecting via hole 1212-1 to prevent from affecting the electrical connection between the first connecting electrode 2222-1 and the fourth connecting part 450. For example, the second notch 2223-1 is a notch formed by inwardly bending one side edge of the first connecting electrode 2222-1 directly opposite to the second connecting via hole 1212-1 and close to the first color sub-pixel 210, and the edge of the notch extends to the edge of the first main electrode 2221-1.

For example, as illustrated in FIG. 14, a part of the connecting electrode 22-1 close to the main electrode 21-1 is relatively wide in the X direction, that is, a width from a part of the connecting via hole connected with the connecting electrode 22-1 to the main electrode 21-1 is relatively large in the X direction. Therefore, after the second notch 2223-1 illustrated in FIG. 13 is formed on the connecting electrode 22-1 illustrated in FIG. 14, it can be ensured that the first connecting electrode 2222-1 can still be reliably connected with the fourth connecting part 450 through the second connecting via hole 1212-1.

For example, as illustrated in FIGS. 12-13, in the second color sub-pixel 220, the first connecting electrode 2222-2 is connected to the fourth connecting part 450 through the third connecting via hole 1212-2, and the third notch 2223-2 is located at a side of the third connecting via hole 1212-2 close to the first color sub-pixel 210 located in the same repeating unit as the second color sub-pixel 220. The concaved degree of the third notch 2223-2 depends on a distance from the edge of the first connecting electrode 2222-2 to the third connecting via hole 1212-2, and the third notch 2223-2 needs to avoid the third connecting via hole 1212-2 to prevent from affecting the electrical connection between the first connecting electrode 2222-2 and the fourth connecting part 450. For example, the third notch 2223-2 is a notch formed by inwardly bending one side edge of the first connecting electrode 2222-2 directly opposite to the third connecting via hole 1212-2 and close to the first color sub-pixel 210, and the edge of the notch extends to the edge of the first main electrode 2221-2.

For example, as illustrated in FIG. 14, a part of the connecting electrode 22-2 close to the main electrode 21-2 is relatively wide in the X direction, that is, a width from a portion of the connecting via hole connected with the connecting electrode 22-2 to the main electrode 21-2 is relatively large in the X direction. Therefore, after the third notch 2223-2 illustrated in FIG. 13 is formed on the connecting electrode 22-2 illustrated in FIG. 14, it can be ensured that the first connecting electrode 2222-2 can still be reliably connected with the fourth connecting part 450 through the third connecting via hole 1212-2.

For example, as illustrated in FIG. 12-FIG. 13, in the second electrode 232 of the third color sub-pixel pair 230, a fourth notch 2323 is provided at a part where the third connecting electrode 2322 and the third main electrode 2321 are connected, and a region of the display substrate corresponding to at least part of the fourth notch 2323 is a transparent region 10. That is, the part of the fourth notch 2323 has no overlap with the active semiconductor layer 310, the first conductive layer 320, the second conductive layer 330, the source-drain metal layer 340 and the third conductive layer 350, and a region of the fourth notch 2323 that has no overlap with the above-mentioned film layers forms a transparent region of the display substrate. As illustrated in FIG. 13-FIG. 14, the fourth notch 2323 is a concave part of the second connecting electrode 232 in the embodiment of the disclosure concaved relative to the connecting electrode 2322 illustrated in FIG. 14, a portion of the concave part overlaps with the light shielding film layers such as the active semiconductor layer 310, the first conductive layer 320 and the source/drain metal layer 340, and the other portion of the concave part only overlaps with the base substrate 100 and the multiple transparent insulating layers, that is, the position of the fourth notch should be selected in consideration of its positional relationship with the light-transmitting area exposed by the light shielding film layer(s) except the film layer where the second electrode is located, and at least a part of the fourth notch and the above-mentioned light-transmitting area together constitute the transparent region of the display substrate.

For example, the side of the connecting electrode 32 connected to the main electrode 31 illustrated in FIG. 14 is substantially a straight side, and the fourth notch 2323 illustrated in FIG. 13 is a notch formed by bending the straight side towards the side close to the third main electrode 2321. Compared with the display substrate illustrated in FIG. 14, the embodiment of the present disclosure can improve the light transmittance of the display substrate and further improve the sensitivity of fingerprint detection by providing a notch at a position on the second connecting electrode directly opposite to the light-transmitting area exposed by the light shielding film layer(s) except the film layer where the second electrode is located.

For example, as illustrated in FIG. 12-FIG. 13, along the direction perpendicular to the base substrate 100, in the area surrounded by the data line Vd connected to the pixel circuit of the second sub-pixel of the second color pixel pair, the active semiconductor layer 310, and a film layer where the first electrode CC1 of the storage capacitor C is located, a region 104 away from the light-emitting control signal EM has an overlap with the fourth notch 2323 of the second electrode 2322 of the third color sub-pixel 230. Compared with the connecting electrode 32 illustrated in FIG. 14, in the embodiment of the present disclosure, the light transmittance of the display substrate can be increased by providing the fourth notch 2323 at a part of the third connecting electrode 2322 corresponding to the region 104.

A part of the connecting electrode 32 close to the first color sub-pixel illustrated in FIG. 14 overlaps with the light-transmitting area exposed by the light shielding film layer(s) except the film layer where the second electrode is located. In the embodiment of the present disclosure, the light transmittance of the display substrate can be improved by removing a part of the third connecting electrode 2322 which is close to the first color sub-pixel and covers the above-mentioned light-transmitting area to form the fourth notch 2323.

For example, as illustrated in FIG. 12-FIG. 13, in the third color sub-pixel 230, the first connecting electrode 2322 is connected to the fourth connecting part 450 through the fourth connecting via hole 1213, and the fourth notch 2323 is located at a side of the fourth connecting via hole 1213 close to the first color sub-pixel 210 adjacent to the third color sub-pixel 230. The concaved degree of the fourth notch 2323 depends on a distance from the edge of the first connecting electrode 2322 to the fourth connecting via hole 1213, and the fourth notch 2323 needs to avoid the fourth connecting via hole 1213 to prevent from affecting the electrical connection between the first connecting electrode 2223 and the fourth connecting part 450. For example, the fourth notch 2323 is a notch formed by inwardly bending one side edge of the first connecting electrode 2223 directly opposite to the fourth connecting via hole 1213 and close to the first color sub-pixel 210, and the edge of the notch extends to the edge of the first main electrode 2321.

For example, as illustrated in FIG. 14, a portion of the connecting electrode 32 close to the main electrode 31 is relatively wide in the X direction, that is, a width from a portion of the connecting via hole connected with the connecting electrode 32 to the main electrode 31 is larger in the X direction. Therefore, after the fourth notch 2323 illustrated in FIG. 13 is formed on the connecting electrode 32 illustrated in FIG. 14, it can be ensured that the first connecting electrode 2223 can still be reliably connected with the fourth connecting part 450 through the fourth connecting via hole 1213.

According to another embodiment of the present disclosure, a display device is provided. The display device includes any one of the above-described display substrates. A display device including the display substrate described above can avoid the occurrence of color deviation as far as possible.

The display device provided by the embodiment of the disclosure can apply fingerprint detection technology, and the display substrate included in the display device has high sensitivity of fingerprint detection.

The following statements should be noted:
(1) The accompanying drawings related to the embodiment(s) of the present disclosure involve only the structure(s) in connection with the embodiment(s) of the present disclosure, and other structure(s) can be referred to common design(s).
(2) In case of no conflict, features in one embodiment or in different embodiments of the present disclosure can be combined.

The foregoing is merely exemplary embodiments of the invention, but is not used to limit the protection scope of the invention. The protection scope of the invention shall be defined by the attached claims.

What is claimed is:
1. A display substrate, comprising:
a base substrate;
a first power signal line on the base substrate, the first power signal line comprising a plurality of first power signal sub-lines extending along a first direction and a plurality of second power signal sub-lines extending along a second direction, wherein the first power signal sub-lines are connected with the second power signal sub-lines;
a pixel defining layer at a side of the first power signal line away from the base substrate, the pixel defining layer comprising a plurality of openings to define effective light-emitting regions of a plurality of sub-pixels, wherein the plurality of sub-pixels comprise a sub-pixel pair including two sub-pixels arranged along the second direction, and the sub-pixel pair comprises two effective light-emitting sub-regions with an interval therebetween;
in a plan view, the first power signal sub-line passes through the interval between the two effective light-emitting sub-regions, at least one second power signal sub-line comprises at least one fracture, and both the two effective light-emitting sub-regions and the inter- val between the two effective light-emitting sub-regions are located at the fracture, so that a virtual straight line extending along the second direction and connecting two ends of a same fracture of the second power signal sub-line passes through the two effective light-emitting sub-regions and the interval;

the display substrate further comprising:

a plurality of second power signal lines extending along the second direction and located between the first power signal line and the base substrate, and the second power signal line and the second power signal sub-line being electrically connected through a via hole located in an insulating layer between the second power signal sub-line and the second power signal line, wherein an orthographic projection of the second power signal sub-line on the base substrate at least partially overlaps with an orthographic projection of the second power signal line on the base substrate, and orthographic projections of the two effective light-emitting sub-regions on the base substrate overlap with the orthographic projection of the second power signal line on the base substrate.

2. The display substrate according to claim 1, wherein, along a direction perpendicular to the base substrate, the second power signal sub-line comprising the fracture has no overlap with the two effective light-emitting sub-regions and has no overlap with the interval.

3. The display substrate according to claim 1, wherein a ratio of distances from an orthographic projection of the first power signal sub-line on the base substrate to two centers of the orthographic projections of the two effective light-emitting sub-regions on the base substrate is 0.9-1.1.

4. The display substrate according to claim 1, wherein two centers of the orthogonal projections of the two effective light-emitting sub-regions on the base substrate are located within the orthogonal projection of the second power signal line on the base substrate.

5. The display substrate according to claim 1, wherein the display substrate comprises a plurality of repeating units on the base substrate, and each of the plurality of repeating units comprises one first color sub-pixel, one second color sub-pixel pair and one third color sub-pixel sequentially arranged along the first direction, wherein the second color sub-pixel pair comprises two second color sub-pixels of the same color, and the sub-pixel pair including two sub-pixels arranged along the second direction is the second color sub-pixel pair, the first color sub-pixel comprises a first effective light-emitting region, the two effective light-emitting sub-regions are two second effective light-emitting regions, and the third color sub-pixel comprises a third effective light-emitting region, wherein, along the second direction, a size of the interval is smaller than that of the first effective light-emitting region, and the size of the interval is smaller than that of the third effective light-emitting region.

6. The display substrate according to claim 5, wherein, in a direction perpendicular to the base substrate, the first effective light-emitting region has no overlap with the second power signal sub-line and the second power signal line, wherein the first effective light-emitting region is located between adjacent second power signal sub-lines, and the first effective light-emitting region is located between adjacent second power signal lines.

7. The display substrate according to claim 6, wherein a center of an orthographic projection of the first effective light-emitting region on the base substrate is located within an orthographic projection of the first power signal sub-line on the base substrate.

8. The display substrate according to claim 6, further comprising:

a plurality of pads extending along the second direction and arranged on the same layer as the first power signal line, wherein two second power signal sub-lines at both sides of the first effective light-emitting region and immediately adjacent to the first effective light-emitting region have different distances from a center line of the first effective light-emitting region extending along the second direction, and the first effective light-emitting region is located between the pad and one of the two second power signal sub-lines which is closer to the center line of the first effective light-emitting region.

9. The display substrate according to claim 8, wherein, in the first direction, a ratio of distances from the center line of the first effective light-emitting region to the pad and the second power signal sub-line located at both sides of the first effective light-emitting region is 0.9-1.1.

10. The display substrate according to claim 8, wherein, in a direction perpendicular to the base substrate, the pad overlaps with the first power signal sub-line and is electrically connected with the first power signal sub-line, wherein the pad has an approximately strip shape, and a center of an orthographic projection of the pad on the base substrate is located within an orthographic projection of the first power signal sub-line on the base substrate.

11. The display substrate according to claim 8, wherein the pad is disposed between the first color sub-pixel and the third color sub-pixel which are arranged along the first direction and adjacent to each other, and the pad is electrically connected with the second power signal sub-line between the first color sub-pixel and the third color sub-pixel.

12. The display substrate according to claim 11, further comprising:

a connecting part disposed in the same layer as the pad and located between the second power signal sub-line and the pad, wherein the pad is connected with the second power signal sub-line through the connecting part, wherein an interval is provided between the pad and the second power signal sub-line connected to the pad, the connecting part is located between the pad and the second power signal sub-line, and the connecting part, the pad and the second power signal sub-line form an annular structure.

13. The display substrate according to claim 12, wherein a plurality of second power signal sub-lines comprises a first signal sub-line and a second signal sub-line alternately arranged along the first direction, wherein the first signal sub-line is a continuous signal line, and the second signal sub-line is a signal line with the fracture.

14. The display substrate according to claim 13, wherein the pad is connected with the second signal sub-line through the connecting part, and an orthographic projection of the pad on another second signal sub-line adjacent to the second signal sub-line connected to the pad is located in the fracture of said another second signal sub-line, wherein, along the second direction, a size of the pad is smaller than a size of the first effective light-emitting region.

15. The display substrate according to claim 5, wherein, in a direction perpendicular to the base substrate, the third effective light-emitting region has no overlap with the second power signal sub-line and the second power signal line,
- wherein the third effective light-emitting region is located between adjacent second power signal sub-lines, and the third effective light-emitting region is located between adjacent second power signal lines,
- wherein a center of an orthographic projection of the third effective light-emitting region on the base substrate is located within an orthographic projection of the first power signal sub-line on the base substrate.

16. The display substrate according to claim 15, wherein a ratio of distances from centers of orthographic projections of the two second power signal sub-lines located at both sides of the third color sub-pixel and immediately adjacent to the third color sub-pixel on the base substrate to a center of an orthographic projection of the third effective light-emitting region on the base substrate is 0.9-1.1.

17. The display substrate according to claim 5, wherein each sub-pixel comprises an organic light-emitting element, and the organic light-emitting element comprises a first electrode, a light-emitting layer and a second electrode which are sequentially stacked, at least a part of the light-emitting layer is located in the opening, and the second electrode is located at a side of the pixel defining layer facing the base substrate,
- in the first color sub-pixel, an area ratio of the first effective light-emitting region to the second electrode is 53%-55%; in the second color sub-pixel pair, an area ratio of the two second effective light-emitting regions to the two second electrodes is 43.5%-48%; in the third color sub-pixel, an area ratio of the third effective light-emitting region to the second electrode is 67.5%-69%,
- wherein a shape of the first effective light-emitting region and a shape of the third effective light-emitting region comprise hexagon or oval, and a shape of each of the two second effective light-emitting regions comprised in the second color sub-pixel pair comprises pentagon, circle or water drop.

18. The display substrate according to claim 17, wherein the second electrode of each of the color sub-pixels comprises a main electrode and a connecting electrode connected with each other, and a shape of the main electrode is substantially the same as that of the effective light-emitting region of the corresponding sub-pixel;
- in each of the color sub-pixels, a part where the connecting electrode is connected with the main electrode is provided with a notch, and
- along a direction perpendicular to the base substrate, a region of the display substrate corresponding to at least a part of the notch is a transparent region.

19. The display substrate according to claim 5, wherein the first color sub-pixel is a red sub-pixel, the second color sub-pixel is a green sub-pixel, and the third color sub-pixel is a blue sub-pixel.

* * * * *